(12) United States Patent
Cohen et al.

(10) Patent No.: US 11,391,814 B2
(45) Date of Patent: Jul. 19, 2022

(54) SOFTWARE DEFINED RADAR ARCHITECTURES

(71) Applicant: Intel Corporation, Santa Clara, CA (US)

(72) Inventors: Alon Cohen, Modiin (IL); Yaron Kahana, Kfar Saba (IL); Arie Oster, Haifa (IL); Yossi Tsfati, Rishon le Zion (IL)

(73) Assignee: INTEL CORPORATION, Santa Clara, CA (US)

( * ) Notice: Subject to any disclaimer, the term of this patent is extended or adjusted under 35 U.S.C. 154(b) by 348 days.

(21) Appl. No.: 16/442,100

(22) Filed: Jun. 14, 2019

(65) Prior Publication Data

US 2019/0293755 A1   Sep. 26, 2019

(51) Int. Cl.
| | | |
|---|---|---|
| *G01S 7/295* | (2006.01) | |
| *H03M 9/00* | (2006.01) | |
| *G01S 13/89* | (2006.01) | |
| *G01S 13/931* | (2020.01) | |

(52) U.S. Cl.
CPC .............. *G01S 7/295* (2013.01); *G01S 13/89* (2013.01); *G01S 13/931* (2013.01); *H03M 9/00* (2013.01)

(58) Field of Classification Search
None
See application file for complete search history.

(56) References Cited

U.S. PATENT DOCUMENTS

2014/0133322 A1\* 5/2014 Steer .................... H01Q 21/20
370/252

OTHER PUBLICATIONS

Texas Instruments, "AWR1642 Single-CHip 77- and 79-GHz FMCW Radar Sensor," Apr. 2018, 88 pages.

\* cited by examiner

*Primary Examiner* — Whitney Moore
(74) *Attorney, Agent, or Firm* — Hanley, Flight & Zimmerman, LLC

(57) ABSTRACT

Example software defined radar architectures are disclosed. Example chipsets disclosed herein to implement a software defined radar architecture include a digital processor chip including a first serial port and a second serial port. Disclosed example chipsets also include a transmitter chip to generate a plurality of transmit signals based on baseband radar waveform data to be obtained from the digital processor chip, the transmitter chip including a third serial port to communicate with the first serial port of the digital processor chip to obtain the baseband radar waveform data. Disclosed example chipsets further include a receiver chip to determine baseband received radar data from a plurality of radar signals, the receiver chip including a fourth serial port to communicate with the second serial port of the digital processor chip to provide the baseband received radar data to the digital processor chip.

13 Claims, 10 Drawing Sheets

SOFTWARE DEFINED RADAR ARCHITECTURES

FIELD OF THE DISCLOSURE

This disclosure relates generally to radar systems and, more particularly, to software defined radar architectures.

BACKGROUND

Advanced Driver-Assistance Systems (ADAS) and autonomous vehicle (AV) technology has the potential to provide revolutionary products and services in the coming years. For example, AV technology is expected to become a widespread platform for remote surveillance, cargo shipment, human transportation, etc. An important enabler for ADAS and AV technology is the ability to accurately sense an environment in which the AV is operating. For example, to achieve safe and reliable AVs for human transportation, sensing technology will be expected to sense objects at ranges of potentially hundreds of meters from the vehicle with accurate angular resolution in terms of elevation and azimuth, and under many types of lighting and weather conditions.

BRIEF DESCRIPTION OF THE DRAWINGS

The figures are not to scale. In general, the same reference numbers will be used throughout the drawing(s) and accompanying written description to refer to the same or like parts, elements, etc.

Figure 1:
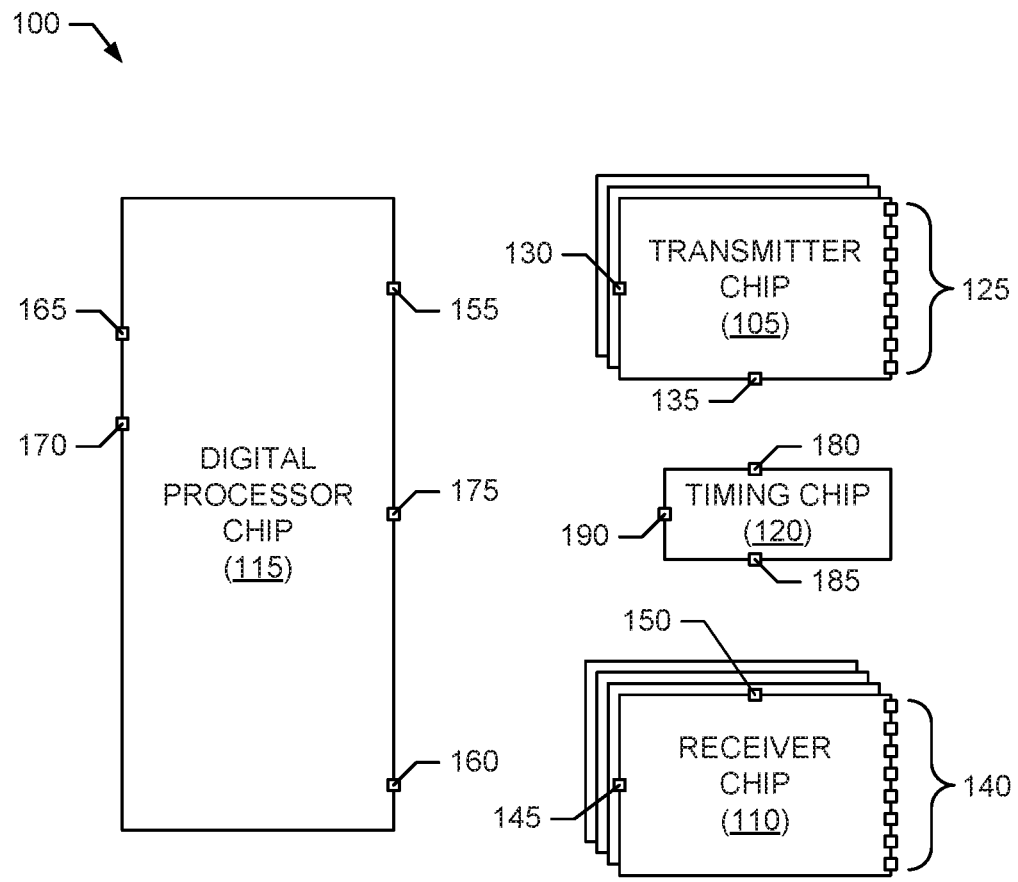
FIG. 1 is a block diagram of an example chipset to implement example software defined radar architectures in accordance with teachings of this disclosure.

Descriptors "first," "second," "third," etc., are used herein when identifying multiple elements or components which may be referred to separately. Unless otherwise specified or understood based on their context of use, such descriptors are not intended to impute any meaning of priority or ordering in time but merely as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

DETAILED DESCRIPTION

Example methods, apparatus, systems and articles of manufacture (e.g., physical storage media) to implement software defined radar architectures are disclosed herein. Example chipsets disclosed herein to implement a radar platform with a software defined radar architecture includes a digital processor chip including a first serial port and a second serial port. Disclosed example chipsets also include a transmitter chip to generate multiple transmit signals based on baseband radar waveform data to be obtained from the digital processor chip. The transmitter chip includes a serial port to communicate with the first serial port of the digital processor chip to obtain the baseband radar waveform data. Disclosed example chipsets further include a receiver chip to determine baseband received radar data from multiple radar signals. The receiver chip includes a serial port to communicate with the second serial port of the digital processor chip to provide the baseband received radar data to the digital processor chip.

Example software defined radar systems disclosed herein include an embedded control unit to process multi-dimensional output radar data, multiple antennas to transmit and receive radio frequency signals, and a software defined radar platform in communication with the embedded control unit and the multiple antennas. In some disclosed examples, the software defined radar platform includes a digital processor chip including a first serial port and a second serial port. In some disclosed examples, the software defined radar platform also includes a transmitter chip to generate multiple transmit signals based on baseband radar waveform data to be obtained from the digital processor chip. The transmitter chip includes a serial port to communicate with the first serial port of the digital processor chip to obtain the baseband radar waveform data. The transmitter chip is to transmit the transmit signals via the antennas. In some disclosed examples, the software defined radar platform further includes a receiver chip to determine baseband received radar data from multiple radar signals, with the receiver chip to receive the multiple radar signals via the multiple antennas, and the receiver chip including a serial port to communicate with the second serial port of the digital processor chip to provide the baseband received radar data to the digital processor chip.

Example computer readable media to implement a software defined radar platform disclosed herein include example instructions which, when executed, cause one or more processors to, for example, generate baseband radar waveform data corresponding to multiple radar transmit signals, and cause the baseband radar waveform data to be written to a first serial port that is to interface with a transmitter chip. Disclosed example instructions, when executed, also cause the one or more processors to, for example, cause baseband received radar data to be read from a second serial port that is to interface with a receiver chip, process the baseband received radar data to determine multi-dimensional output radar data, and cause the multi-dimensional output radar data to be written to an output port.

Example methods disclosed herein to implement a software defined radar platform include programming, with at least one processor, a first direct memory access controller to write baseband radar waveform data to first serializer-deserializer circuitry in communication with a first serial port that is to interface with a transmitter chip, with the baseband radar waveform data corresponding to multiple radar transmit signals. Disclosed example methods also include programming, with the at least one processor, a second direct memory access controller to read baseband received radar data from second serializer-deserializer circuitry in communication with a second serial port that is to interface with a receiver chip. Disclosed example methods further include generating, with the at least one processor, the baseband radar waveform data, processing, with the at least one processor, the baseband received radar data to determine multi-dimensional output radar data, and outputting the multi-dimensional output radar data to an output port These and other example methods, apparatus, systems and articles of manufacture (e.g., physical storage media) to implement software defined radar architectures are disclosed in greater detail below.

As explained above, accurate sensing capability is an important enabler for many technology fields. For example, to enable artificial intelligence (AI) and/or other control algorithms to make correct driving decisions, sensing technology for AVs will be expected to sense objects at ranges of potentially hundreds of meters from the vehicle with accurate angular resolution in terms of elevation and azimuth, and under many types of lighting and weather conditions. Prior sensing technology based on camera imaging technology and light detection and ranging (LiDAR) may be unable to achieve such accurate sensing under poor lighting and/or poor weather conditions. Sensing technology based on radio frequency (RF) radar imaging, such as millimeter wave (mmWave) radar imaging, holds more promise for achieving sufficient sensing capability for AV operation. However, prior mmWave radar imaging technology is limited in terms of the number of radar transmitters and receivers that can be employed without performance degradation, which limits the resolution and sensitivity of such prior solutions. Furthermore, prior mmWave radar imaging technology may be limited to utilizing hardwired/hardcoded transmit waveforms and radar signal processing that cannot be adapted to some operating environment(s). Such drawbacks of prior mmWave radar imaging technology is further exacerbated in dense operating environments containing multiple AVs with associated radars that interfere with each other.

In contrast with such prior sensing technology, software defined radar architectures disclosed herein provide RF radar imaging solutions having a flexible, multiple-input multiple-output (MIMO) radar architecture. The MIMO architecture includes multiple (e.g., M) transmitters supporting transmission of multiple transmit waveforms (which may be orthogonal and independent), and multiple (e.g., N) receivers supporting reception of multiple received radar signals, along with signal processing to correlate the multiple received radar signals with the multiple transmit waveforms to achieve a multitude (e.g., M×N) of virtual radar channels. Software defined radar architectures, as disclosed herein, leverage disclosed example chipsets (also referred to as software defined radar chipsets) structured to implement a digital MIMO radar architecture to achieve high-resolution, four-dimensional (4D) radar imaging (e.g., by outputting high-resolution 4D radar imaging data, such as azimuth, elevation, range and doppler values).

For example, disclosed example chipsets include one or more transmitter chips structured to implement multiple transmit channels with flexibility to transmit any generated modulation waveform on any of the different transmit channels simultaneously, with the characteristics of the transmit channels being software configurable. Disclosed example chipsets also include one or more receiver chips structured to implement multiple receive channels capable of receiving their respective radar signals simultaneously, with the characteristics of the receive channels being software configurable. Disclosed example chipsets also include a digital processor chip structured to generate the modulation waveform(s) to be transmitted on the different transmit channels, and to implement any appropriate signal processing of the received radar signals to create a 4D radar image output, with the characteristics of the modulation waveform(s) and/or received signal processing being software configurable. Disclosed example chipsets further include a timing chip structured to provide the timing sources (e.g., clock signals) for the transmitter chips, the receiver chips and the digital processor chips, with the characteristics of the timing sources being software configurable. In some examples, some or all of the structure of the timing chip can be incorporated into one or more of the transmitter chips, the receiver chips and/or the digital processor chips. In some examples, the timing chip is omitted from the chipset and one or more external clock sources are used to provide the clock signals to the transmitter chip(s), the receiver chip(s) and/or the digital processor chip. Because the operational characteristics of the transmitter chip(s), receiver chip(s), digital processor chip(s) and/or timing chip(s) may be software configurable, disclosed example chipsets are able to implement software defined radar architectures.

As disclosed in further detail below, the transmitter chip(s), the receiver chip(s) and the digital processor chip of disclosed example chipsets include serial-deserial (SerDes) circuitry and associated ports to implement SerDes interfaces by which data is exchanged between the digital processor chip and the transmitter chip(s), and between the digital processor chip and the receiver chip(s). The SerDes interfaces enable disclosed example chipsets to achieve a fully digital MIMO radar architecture. Thus, such SerDes interfaces avoid the analog noise and leakage problems associated with prior RF radar imaging technology.

Turning to the figures, a block diagram of an example software defined radar chipset 100 structured to implement example software defined radar architectures in accordance with teachings of this disclosure is illustrated in FIG. 1. The example chipset 100 includes and one or more example transmitter chips 105 (also referred to as radar transmitter chip(s) 105), one or more example receiver chips 110 (also referred to as radar receiver chip(s) 110), an example digital processor chip 115 (also referred to as a radar digital processor chip 115) and an example timing chip 120 (also referred to as a radar timing chip 120). The number of transmitter chip(s) 105 and the number of receiver chip(s) 110 in the example chipset 100 may be the same or different. Furthermore, although one digital processor chip 115 and one timing chip 120 are shown in the chipset 100 of the illustrated example, any number of digital processor chip(s) 115 and/or any number of timing chip(s) 120 may be included in the example chipset 100. The transmitter chip(s) 105, the receiver chip(s) 110, the digital processor chip(s) 115 and the example timing chip(s) 120 can be implemented by any type(s) and/or number(s) of integrated circuits, gate arrays, digital devices, memories, etc. For example, the transmitter chip(s) 105, the receiver chip(s) 110, the digital processor chip(s) 115 and the example timing chip(s) 120 may be implemented by respective integrated circuits, gate arrays, processors, memories, etc., contained in respective packages, such as respective complementary metal-oxide-semiconductor (CMOS) integrated circuits contained in respective packages. In some such examples, the respective packages have input/output (I/O) interfaces, such I/O pins, busses, etc., to permit in circuit communication (e.g., such as electrical coupling, optical coupling, etc.) among the transmitter chip(s) 105, the receiver chip(s) 110, the digital processor chip(s) 115 and the example timing chip(s) 120 in accordance with teachings of this disclosure. In some examples, some or all of the transmitter chip(s) 105, the receiver chip(s) 110, the digital processor chip(s) 115 and the example timing chip(s) 120 are implemented as respective hardware circuits (e.g., such as hardware circuits including digital logic circuitry, analog circuitry, electronic and/or optical components, etc.) included in a single integrated circuit package, such as in a system-on-a-chip (SoC) implementation.

An example transmitter chip 105 of the illustrated example chipset 100 of FIG. 1 includes any number of RF transmitters, such as wideband RF transmitters, structured to generate respective radar transmit signals to output via antennas communicatively coupled to respective transmit antenna ports 125 of the transmitter chip 105. For example, the transmitter chip 105 may include eight (or some other number of) RF transmitters to generate and output (independently and simultaneously, in some examples) respective transmit signals to eight (or some other number of) transmit antenna ports 125. Each RF transmitter included in the transmitter chip 105 is structured to generate its respective transmit signal from baseband radar waveform data read from a memory, such as a random access memory (RAM), included in the transmitter chip 105. In some examples, the baseband waveform data is data with spectral content concentrated in a frequency range from 0 Hertz (Hz) up to a cut-off frequency sufficient to represent the information conveyed by the baseband waveform data, which is then up-converted by the RF transmitters to the carrier frequencies associated with the respective RF transmitters. The transmitter chip 105 of the illustrated example includes an example input serial port 130 to interface with the digital processor chip 115 to obtain the baseband radar waveform data from the digital processor chip 115. In some examples in which the transmitter chip 105 is implemented as a hardware circuit included in a single package implementation, such as an SoC implementation, the serial port 130 is replaced with a digital data interface structured to communicate data bits in parallel, such as a bus, group of communication lines, etc., that communicates with (e.g., electrically couples to) the hardware circuit implementing the digital processor chip 115 to thereby obtain the baseband radar waveform data from the digital processor chip 115. However, a serial data interface such as or similar to the serial port 130 may additionally or alternatively be used by the transmitter chip 105 in some example single package (e.g., SoC) implementations to obtain the baseband radar waveform data from the digital processor chip 115. In some examples, the baseband radar waveform data stored in the memory for some or all of the RF transmitters included in the transmitter chip 105 may be different. In some examples, the baseband radar waveform data stored in the memory may be updated by the digital processor chip 115 between radar scan intervals and/or within a radar scan interval. The transmitter chip 105 also includes transmitter clock input port 135 to accept an input clock from the timing chip 120.

An example receiver chip 110 of the illustrated example chipset 100 of FIG. 1 includes any number of RF receivers, such as one or more wideband RF receivers, structured to receive respective received radar signals from antennas communicatively coupled to respective example receive antenna ports 140 of the receiver chip 110. For example, the receiver chip 110 may include eight (or some other number of) RF receivers to receive (independently and simultaneously, in some examples) respective radar signals from eight (or some other number of) receive antenna ports 140. Each RF receiver included in the receiver chip 110 is structured to determine respective baseband received radar data from its respective received radar signal and to store (write) its baseband received radar data into a memory, such as RAM, included in the receiver chip 110. In some examples, the baseband received radar data is data with spectral content concentrated in a frequency range from 0 Hz up to a cut-off frequency sufficient to represent the information conveyed by the baseband received radar data, which is obtained by down-conversion of the received radar signals by the RF receivers based on the carrier frequencies associated with the respective RF receivers. The receiver chip 110 of the illustrated example includes an example output serial port 145 to interface with the digital processor chip 115 to output the baseband received radar data to the digital processor chip 115. In some examples in which the receiver chip 110 is implemented as a hardware circuit included in a single package implementation, such as an SoC implementation, the serial port 145 is replaced with a digital data interface structured to communicate data bits in parallel, such as a bus, group of communication lines, etc., that communicates with (e.g., electrically couples to) the hardware circuit implementing the digital processor chip 115 to thereby output the baseband received radar data to the digital processor chip 115. However, a serial data interface such as or similar to the serial port 130 may additionally or alternatively be used by the transmitter chip 105 in some example single package (e.g., SoC) implementations to output the baseband received radar data to the digital processor chip 115. The receiver chip 110 also includes an example receiver clock input port 150 to accept an input clock from the timing chip 120.

The digital processor chip 115 of the illustrated example chipset 100 of FIG. 1 is structured to generate the baseband radar waveform data to be provided to the transmitter chip(s) 105. To output the baseband radar waveform data to the transmitter chip(s) 105, the digital processor chip 115 includes one or more example transmitter serial ports 155. In some examples, the digital processor chip 115 includes multiple (e.g., four or some other number of) transmitter serial ports 155 to be able to interface with the respective input serial ports 130 of multiple (e.g., up to four or some other number of) transmitter chips 105. In some examples in which the digital processor chip 115 is implemented as a hardware circuit included in a single package implementation, such as an SoC implementation, the transmitter serial port 155 are replaced with one or more digital data interfaces structured to communicate data bits in parallel, such as one or more busses, groups of communication lines, etc., that communicate with (e.g., electrically couple to) the hardware circuit implementing the transmitter chip(s) 105 to thereby output the baseband radar waveform data to the transmitter chip(s) 105. However, one or more serial data interfaces such as or similar to the transmitter serial ports 155 may additionally or alternatively be used by the digital processor chip 115 in some example single package (e.g., SoC) implementations to output the baseband radar waveform data to the transmitter chip(s) 105. In some examples, the baseband radar waveform data generated and output by the digital processor chip 115 for some or all of the RF transmitters included in a given transmitter chip 105 may be different. In some examples, the baseband radar waveform data to be output for a given transmitter chip 105 may be updated by the digital processor chip 115 between radar scan intervals and/or within a radar scan interval.

The digital processor chip 115 of the illustrated example is also structured to include one or more processors, such as digital signal processors (DSPs), and/or one or more hardware accelerators to process the baseband received radar data received from the receiver chip(s) 110. To obtain the baseband received radar data from the receiver chip(s) 110, the digital processor chip 115 includes one or more example receiver serial ports 160. In some examples, the digital processor chip 115 includes multiple (e.g., twelve or some other number of) receiver serial ports 160 to be able to interface with the respective output serial ports 145 of multiple (e.g., up to twelve or some other number of) receiver chips 110. In some examples in which the digital processor chip 115 is implemented as a hardware circuit included in a single package implementation, such as an SoC implementation, the receiver serial ports 160 are replaced with one or more digital data interfaces structured to communicate data bits in parallel, such as one or more busses, groups of communication lines, etc., that communicate with (e.g., electrically couple to) the hardware circuit implementing the receiver chip(s) 110 to thereby obtain the baseband received radar data from the receiver chip(s) 110. However, one or more serial data interfaces such as or similar to the receiver serial ports 160 may additionally or alternatively be used by the digital processor chip 115 in some example single package (e.g., SoC) implementations to obtain the baseband received radar data from the receiver chip(s) 110. In some examples, the radar signal processing performed by the processor(s) and/or hardware accelerator(s) of the digital processor chip 115 may be tailored (and adapted over time, as appropriate) to correspond to the particular baseband radar waveform data provided by the digital processor chip 115 to the transmitter chip(s) 105.

In the illustrated example, the digital processor chip 115 processes the baseband received radar data obtained from the receiver chip(s) 110 via the receiver serial port(s) 160 to determine four-dimensional (4D) radar imaging data. For example, the four dimensions of the 4D radar imaging data may correspond to azimuth, elevation, range and doppler values determined from the baseband received radar data for a given radar scan interval. The radar scan interval defines the update rate, or frame rate, of the 4D radar imaging data, which may be multiple frames per second. The digital processor chip 115 includes an example output stream port 165, which may be a serial port, a parallel port/bus, a network port, etc., to output the 4D radar imaging data to an external processing device, such as an embedded control unit, that is to process the 4D radar imaging data. For example, the embedded control unit may use the 4D radar imaging data as sensor data for an AI algorithm to control (e.g., drive) an AV. In the illustrated example, the digital processor chip 115 also includes an example control port 170, which may be a serial port, a parallel port/bus, a network port, etc., to receive control data from an external processing device, such as the embedded control unit mentioned above. For example, the control data obtained via the control port 170 may configure parameters of the chipset 100, such as, but not limited to, clock rates for the respective chips in the chipset 100, a radar scan rate and/or duration of the radar scan interval, parameters and/or other characteristic of the baseband radar waveform data to be generated for the transmitter chip(s) 105, parameters and/or other characteristic of the signal processing to be performed on the baseband received radar data to obtained from the receiver chip(s) 110, etc. The digital processor chip 115 also includes a system clock input port 175 to accept an input clock from the timing chip 120.

The timing chip 120 of the illustrated example chipset 100 of FIG. 1 is structured to generate clock signals for the transmitter chip(s) 105, the receiver chip(s) 110 and the digital processor chip 115 of the example chipset 100. As such, the timing chip 120 includes an example transmitter clock output port 180 to output a clock signal to be provided to the respective transmitter clock input port(s) 135 of the transmitter chip(s) 105. The timing chip 120 also includes an example receiver clock output port 185 to output a clock signal to be provided to the respective receiver clock input port(s) 150 of the receiver chip(s) 110. The timing chip 120 further includes an example system clock output port 190 to output a clock signal to be provided to the system clock input port 175 of the digital processor chip 115. The respective clock signals output by the timing chip 120 from its transmitter clock output port 180, receiver clock output port 185 and system clock output port 190 may have the same characteristics (e.g., same amplitude, same frequency, etc.) or different characteristics (different amplitude and/or different frequency, etc.), but are based on a sample clock source (e.g., a same temperature controlled crystal oscillator or other timing source) and, thus, are synchronized (e.g., in-phase) relative to each other, thereby achieving coherent operation between the transmitter chip(s) 105, the receiver chip(s) 110, and the digital processor chip 115. For example, the timing chip 120 may output clock signals with the same frequency from its transmitter clock output port 180 and receiver clock output port 185, but may output a clock signal with a different frequency from its system clock output port 190. In some examples, some or all of the structure of the timing chip 120 can be incorporated into one or more of the transmitter chip(s) 105, the receiver chip(s) 110 and/or the digital processor chip 115 of the example chipset 100. In some examples, the timing chip 120 is omitted from the example chipset 100 and one or more external clock sources are used to provide the appropriate clock signals to the transmitter clock input port(s) 135 of the transmitter chip(s) 105, the receiver clock input port(s) 150 of the receiver chip(s) 110 and/or the system clock input port 175 of the digital processor chip 115.

Figure 2:
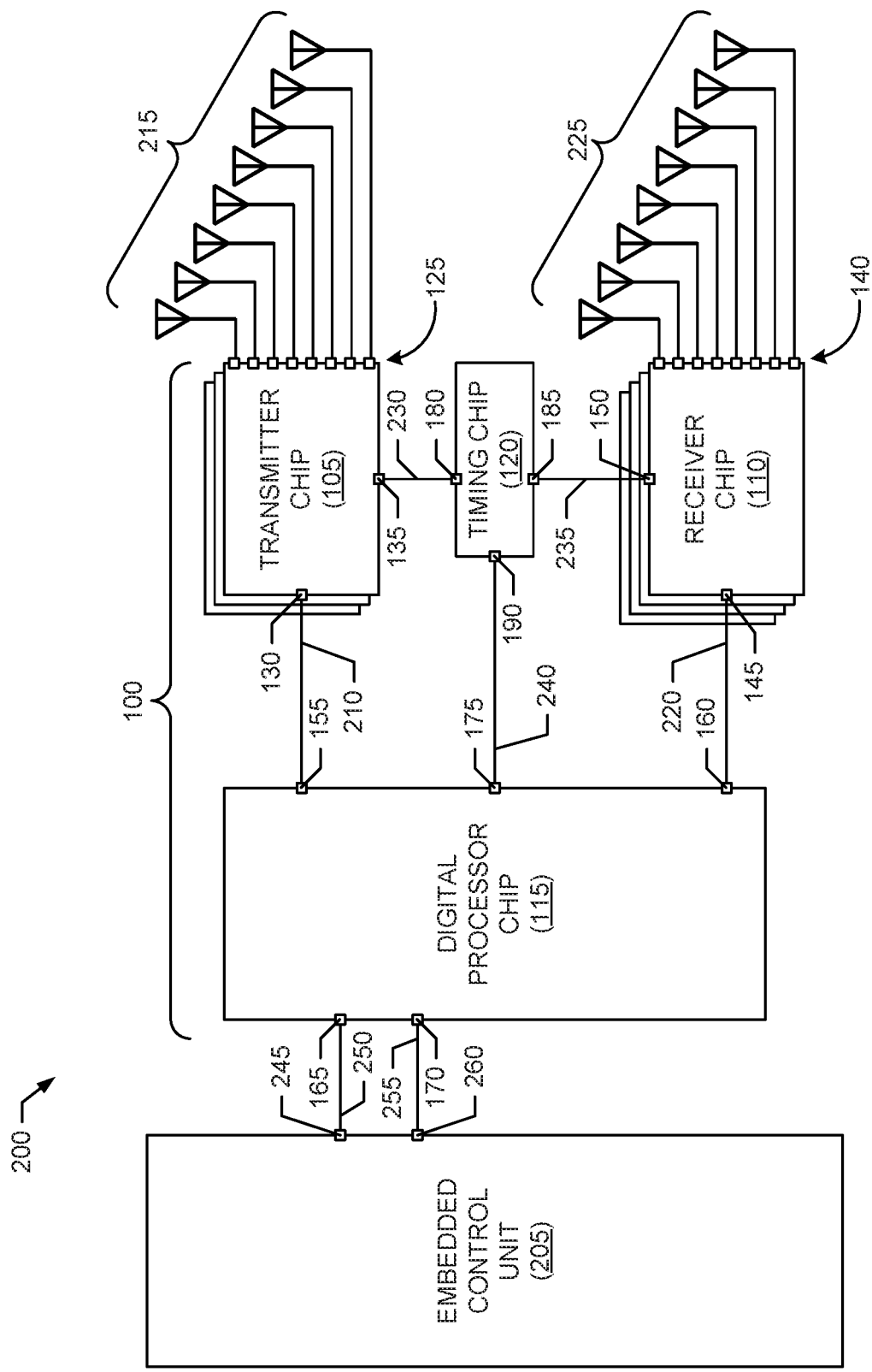
FIG. 2 is a block diagram of a first example radar imaging system implemented with the example chipset of FIG. 1.

A block diagram of a first example radar imaging system 200 implemented with the example chipset 100 of FIG. 1 is illustrated in FIG. 2. In the illustrated example of FIG. 2, the chipset 100 is arranged to implement a digital MIMO radar architecture to provide 4D radar imaging data to an example embedded control unit 205. The embedded control unit 205 can be any device, processor, circuit, etc., capable of accessing and processing 4D radar imaging data obtained with the chipset 100. For example, radar imaging system 200 can be included in an AV to implement AI control of the AV. In such an example, the embedded control unit 205 can apply the 4D radar imaging data obtained from the chipset 100 to an AI algorithm implemented by the embedded control unit 205 to control (e.g., drive) the AV.

In the illustrated example of FIG. 2, the input serial port(s) 130 of the respective transmitter chip(s) 105 are coupled (e.g., electrically) to the transmitter serial port(s) 155 of the digital processor chip 115 to implement an example transmitter digital serial interface 210 between the digital processor chip 115 and the transmitter chip(s) 105. For example, in an example chipset 100 including four transmitter chips 105, each input serial port 130 of a respective transmitter chip 105 is coupled to a respective one of four transmitter serial ports 155 of the digital processor chip 115 to implement the transmitter digital serial interface 210. In the illustrated example of FIG. 2, the respective transmit antenna ports 125 of the transmitter chip(s) 105 are coupled (e.g., electrically) to respective transmit antennas 215, which may be implemented by any type of antenna technology, such as an antenna array. For example, in an example chipset including four transmitter chips 105, with each transmitter chip 105 including eight RF transmitters, the 4*8=32 total transmit antenna ports 125 of the four transmitter chips 105 are coupled to respective ones of 32 total transmit antennas 215.

In the illustrated example of FIG. 2, the output serial port(s) 145 of the respective receiver chip(s) 110 are coupled (e.g., electrically) to the receiver serial port(s) 160 of the digital processor chip 115 to implement an example receiver digital serial interface 220 between the digital processor chip 115 and the receiver chip(s) 110. For example, in an example chipset 100 including twelve receiver chips 110, each output serial port 145 of a respective receiver chip 110 is coupled to a respective one of twelve receiver serial ports 160 of the digital processor chip 115 to implement the receiver digital serial interface 220. In the illustrated example of FIG. 2, the respective receive antenna ports 140 of the receiver chip(s) 110 are coupled (e.g., electrically) to respective receive antennas 225, which may be implemented by any type of antenna technology, such as an antenna array. For example, in an example chipset including twelve receiver chips 110, with each receiver chip 110 including eight RF receivers, the 12*8=96 total receive antenna ports 125 of the twelve receiver chips 110 are coupled to respective ones of 96 total receive antennas 225.

In the illustrated example of FIG. 2, the transmitter clock output port 180 of the timing chip 120 is coupled (e.g., electrically) to the respective transmitter clock input port(s) 135 of the transmitter chip(s) 105 to implement an example transmitter clock digital interface 230 between the timing chip 120 and the transmitter chip(s) 105. For example, in an example chipset 100 including four transmitter chips 105, each transmitter clock input port 135 of a respective transmitter chip 105 is coupled to the transmitter clock output port 180 of the timing chip 120 to implement the transmitter clock digital interface 230. In the illustrated example of FIG. 2, the receiver clock output port 185 of the timing chip 120 is coupled (e.g., electrically) to the respective receiver clock input port(s) 150 of the receiver chip(s) 110 to implement an example receiver clock digital interface 235 between the timing chip 120 and the receiver chip(s) 110. For example, in an example chipset 100 including twelve receiver chips 110, each receiver clock input port 150 of a respective transmitter chip 105 is coupled to the receiver clock output port 185 of the timing chip 120 to implement the receiver clock digital interface 235. In the illustrated example of FIG. 2, the system clock output port 190 of the timing chip 120 is coupled (e.g., electrically) to the system clock input port 175 of the digital processor chip 115 to implement an example system clock digital interface 240 between the timing chip 120 and the digital processor chip 115.

In the illustrated example of FIG. 2, the output stream port 165 of the digital processor chip 115 is coupled (e.g., electrically) with an example input stream port 245 of the embedded control unit 205 to implement an example digital data stream interface 250 between the digital processor chip 115 and the embedded control unit 205 via which the embedded control unit 205 is to obtain the 4D radar imaging data output from the digital processor 205. For example, the input stream port 245 of the embedded control unit 205 may be a serial port, a parallel port/bus, a network port, etc. In the illustrated example of FIG. 2, the control port 170 of the digital processor chip 115 is coupled (e.g., electrically) with an example control port 260 of the embedded control unit 205 to implement an example digital control interface 260 between the digital processor chip 115 and the embedded control unit 205 via which the embedded control unit 205 can control operation of the digital processor chip 115 and, more generally, operation of the chipset 100. For example, the input stream port 245 of the embedded control unit 205 may be a serial port, a parallel port/bus, a network port, etc.

Figure 3:
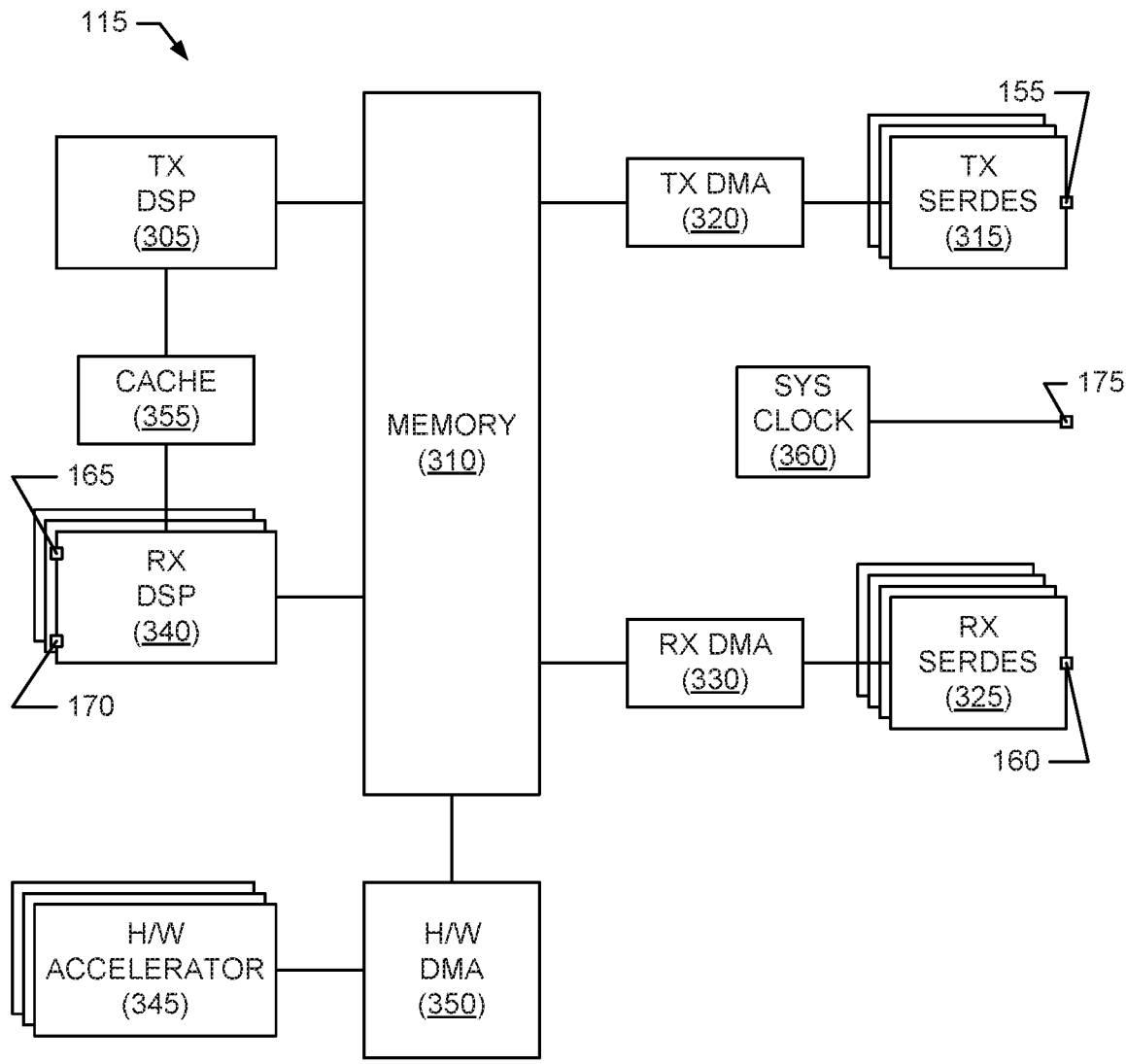
FIG. 3 is a block diagram of an example digital processor chip included in the example chipset of FIG. 1.

A block diagram of an example implementation of the digital processor chip 115 of the example chipset 100 of FIG. 1 is illustrated in FIG. 3. The example digital processor chip 115 of FIG. 3 includes the transmitter serial port(s) 155, the receiver serial port(s) 160, output stream port 165, the control port 170 and the system clock input port 175. The example digital processor chip 115 of FIG. 3 also includes an example transmit digital signal processor (DSP) 305 to generate the baseband radar waveform data to be provided to the transmitter chip(s) 105 of the chipset 100 via the transmitter serial port(s) 155. Accordingly, the example digital processor chip 115 is an example of means for generating baseband radar waveform data, and providing the baseband radar waveform data for transmission, in accordance with teachings of this disclosure. In some examples, the DSP 305 is software configurable (e.g., through configuration inputs, software code downloaded to the DSP 305, etc.) to generate the baseband radar waveform data based on the software configuration. The example digital processor chip 115 of FIG. 3 includes an example memory 310 to store the baseband radar waveform data generated by the transmit DSP 305. The example memory 310 can be implemented by a multiport RAM and/or any other type(s) and/or number(s) of memories. The example digital processor chip 115 of FIG. 3 further includes one or more example transmit serializer-deserializer (SerDes) circuits 315 in communication with the transmitter serial port(s) 155. In the illustrated example, the transmit SerDes circuit(s) 315 access the baseband radar waveform data from the memory 310, and write the accessed baseband radar waveform data to the transmitter serial port(s) 155. For example, the transmit SerDes circuit(s) 315 read the baseband radar waveform data from the memory 310 in parallel form (e.g., as data words each having a word length of a number of bits, such as 8 bits, 16 bits, 32 bits, etc.), and convert the baseband radar waveform data to a serial form (e.g., as serial data bits) to output via the transmitter serial port(s) 155. In some examples, the digital processor chip 115 includes an example transmit direct memory access (DMA) circuit 320 to transfer data from the memory 310 to the transmit SerDes circuit(s) 315 using DMA operations. In examples in which the digital processor chip 115 includes multiple transmitter serial ports 155, each transmitter serial port 155 is in communication with a respective transmit SerDes circuit 315 that is configured to access the respective baseband radar waveform data from the memory 310 for the transmitter chip 105 coupled to that transmitter serial port 155, and is configured to write the respective accessed baseband radar waveform data to that transmitter serial port 155.

The example digital processor chip 115 of FIG. 3 includes one or more example receive SerDes circuits 325 in communication with the receiver serial port(s) 160. In the illustrated example, the receive SerDes circuit(s) 325 obtain the baseband received radar data from the receiver serial port(s) 160, and write the baseband received radar data to the memory 310. For example, the receive SerDes circuit(s) 325 reads the baseband received radar data from the receiver serial port(s) 160 in serial form (e.g., as serial data bits), and converts the baseband received radar data to a parallel form (e.g., as data words each having a word length of a number of bits, such as 8 bits, 16 bits, 32 bits, etc.) to write to the memory 310. In some examples, the digital processor chip 115 includes an example receive DMA circuit 330 to transfer data from the receive SerDes circuit(s) 325 to the memory 310 using DMA operations. In examples in which the digital processor chip 115 includes multiple receiver serial ports 160, each receiver serial port 160 is in communication with a respective receive SerDes circuit 325 that is configured to obtain the respective baseband received radar data from that receiver serial port 160 for the receiver chip 110 coupled to that receiver serial port 160, and is configured to write the respective accessed baseband received radar data to memory 310.

The example digital processor chip 115 of FIG. 3 further includes one or more example receive DSPs 340 and one or more example hardware accelerators 345 to process the baseband received radar data stored in the memory 310 for a given scan interval to determine multi-dimensional output radar data, such as 4D radar imaging data, for the scan interval. In some examples, the digital processor chip 115 includes an example hardware (H/W) DMA circuit 350 to transfer data between the memory 310 and the hardware accelerator(s) 345 and/or the receive DSP(s) 340 using DMA operations. In the illustrated example, the receive DSPs 340 output the 4D radar imaging data via the output stream port 165. Accordingly, the example digital processor chip 115 is an example of means for processing baseband radar waveform data in accordance with teachings of this disclosure. In some examples, the one or more of the DSPs 340 and/or hardware accelerators 345 are software configurable (e.g., through configuration inputs, software code downloaded to the DSPs 340 and/or hardware accelerators 345, etc.) to implement signal processing (e.g., correlation, cross-correlation, filtering, etc.) of the baseband received radar data based on the software configuration.

In the illustrated example of FIG. 3, the receive DSPs 340 of the digital processor chip 115 also obtain input control data and/or software code via the control port 170. As described above, the control data obtained via the control port 170 may configure parameters of the chipset 100, such as, but not limited to, clock rates for the respective chips in the chipset 100, a radar scan rate and/or duration of the radar scan interval, parameters and/or other characteristic of the baseband radar waveform data to be generated for the transmitter chip(s) 105, parameters and/or other characteristic of the signal processing to be performed on the baseband received radar data to obtained from the receiver chip(s) 110, etc. In some examples, the digital processor chip 115 includes an example cache 355 to exchange data between the receive DSP(s) 340 and the transmit DSP 305. For example, the cache 355 can be used to exchange control data between the DSP(s) 340 and the transmit DSP 305. Additionally or alternatively, the cache 355 may be used to store baseband radar waveform data, which is generated by the transmit DSP 305, for use in signal processing operations (e.g., correlation and cross-correlation operations) to be performed by the receive DSP(s) 340 and/or hardware accelerator(s) 345 on the baseband received radar data obtained from the receiver serial port(s) 160.

In the illustrated example of FIG. 3, the digital processor chip 115 includes an example system clock circuit 360 to receive the system clock signal via the system clock input port 175. The system clock circuit 360 uses the system clock signal received via the system clock input port 175 to generate appropriate clock signals to drive the other elements (e.g., such as the transmit DSP 305, memory 310, the transmit SerDes circuit(s) 315, the transmit DMA circuit 320, the receive SerDes circuit(s) 325, the receive DMA circuit 330, the receive DSP(s) 340, the hardware accelerator(s) 345, the H/W DMA circuit 350, the cache 355, etc.) of the digital processor chip 115.

Figure 4:
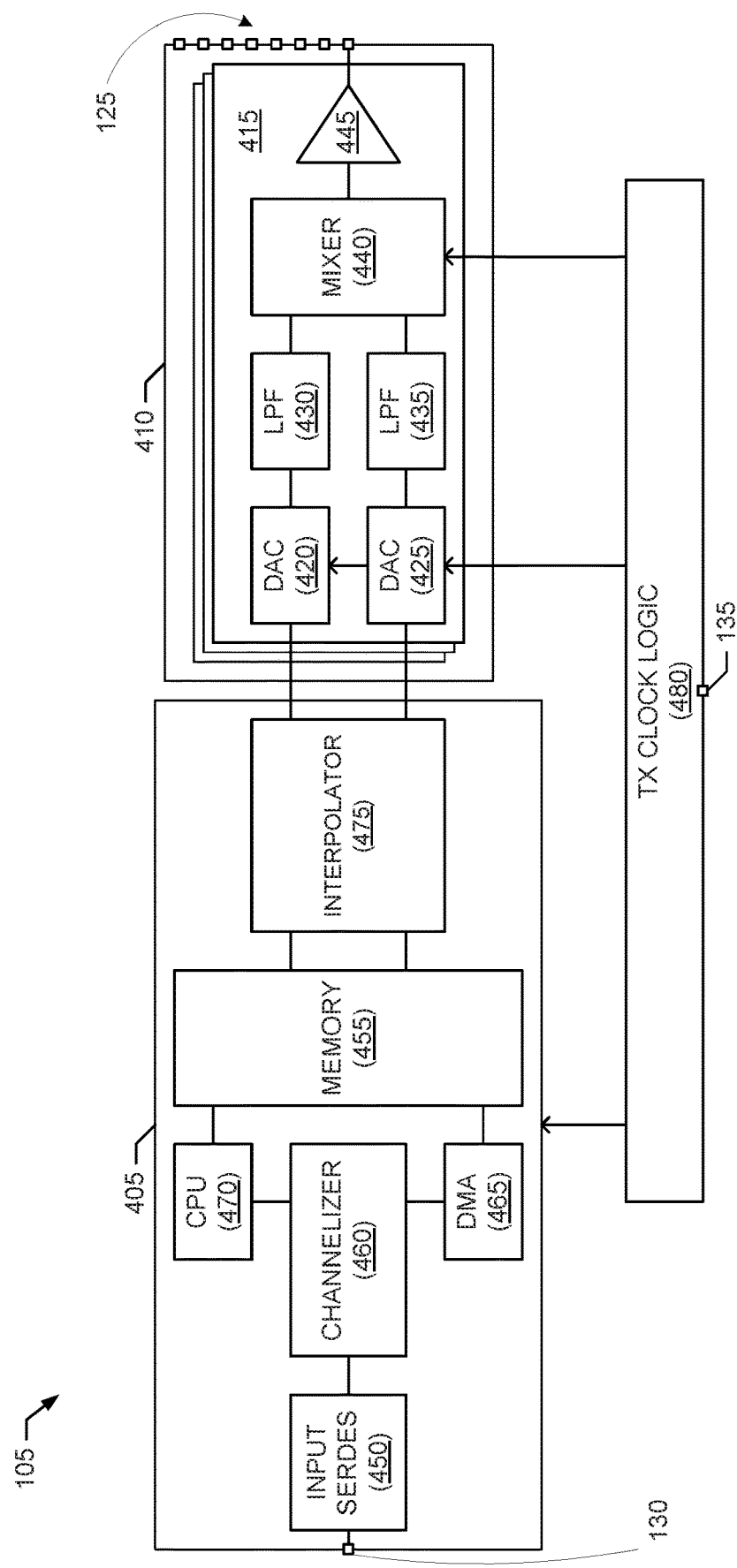
FIG. 4 is a block diagram of an example transmitter chip included in the example chipset of FIG. 1.

A block diagram of an example implementation of a transmitter chip 105 of the example chipset 100 of FIG. 1 is illustrated in FIG. 4. The example transmitter chip 105 of FIG. 4 includes the transmit antenna port(s) 125, input serial port 130 and the transmitter clock input port 135. The example transmitter chip 105 of FIG. 4 also includes an example digital subsystem 405 and an example RF subsystem 410. The digital subsystem 405 of the illustrated example obtains, from the input serial port 130, the baseband radar waveform data to be used by the transmitter chip 105 to generate the RF radar signal(s) for transmission. The RF subsystem 410 of the illustrated example modulates the baseband radar waveform data to generate the RF radar signal(s) and outputs the RF radar signal(s) via the transmit antenna port(s) 125. Accordingly, the example transmitter chip 105 is an example of means for accessing, modulating and transmitting baseband radar waveform data in accordance with teachings of this disclosure.

The example RF subsystem 410 of the transmitter chip 105 includes one or more example RF transmitters 415 to implement one or more respective radar channels via which RF radar signals are to be transmitted. For example, the RF subsystem 410 of the example transmitter chip 105 of FIG. 4 includes eight RF transmitters 415, with each of the eight RF transmitters 415 coupled (e.g., electrically) to a corresponding one of eight transmit antenna ports 125 of the transmitter chip 105. However, in other examples, any number of RF transmitters 415 can be included in the RF subsystem 410. In the illustrated example, the RF transmitters 415 refer to the physical structure(s) (e.g., hardware circuitry and/or software, etc.) used to generate the RF radar signals to be transmitted, the transmit radar channels refer to the characteristics (e.g., bandwidth, carrier frequency, modulation, etc.) of the RF radar signals to be transmitted by the RF transmitters 415, and the RF radar signals refer to the RF energy to be transmitted by the RF transmitters 415.

In the illustrated example, a given RF transmitter 415 is to modulate in-phase (I) and quadrature (Q) baseband radar waveform data applied to the input of the RF transmitter 415 to generate the RF radar signal to be output via its respective antenna port 125. As such, an RF transmitter 415 of the illustrated example includes an example in-phase digital-to-analog converter (DAC) 420 and an example quadrature DAC 425 to convert the input I-Q baseband radar waveform data to corresponding I-Q baseband radar analog signals. The RF transmitter 415 of the illustrated example also includes an example in-phase low pass filter (LPF) 430, an example quadrature LPF 435 and an example mixer 440 to filter and upconvert the I-Q baseband radar analog signals to generate a modulated RF radar signal. The RF transmitter 415 of the illustrated example further includes an example power amplifier (PA) 445 to control a gain applied to the modulated RF radar signal to yield an output RF radar signal having a desired power.

The example digital subsystem 405 of the transmitter chip 105 includes an example input SerDes circuit 450 in communication with the input serial port 130. The input SerDes circuit 450 reads baseband radar waveform data (which is provided by the digital processor chip 115) from the input serial port 130 in serial form (e.g., as serial data bits), and converts the baseband radar waveform data to a parallel form (e.g., as data words each having a word length of a number of bits, such as 8 bits, 16 bits, 32 bits, etc.). The input SerDes circuit 450 writes the baseband radar waveform data to an example memory 455, such as a RAM and/or other memory device, which is to store the baseband radar waveform data.

In the illustrated example of FIG. 4, the transmitter chip 105 is structured to enable different baseband radar waveform data to be applied to different ones, or groups, of the RF transmitters 415. As described above, the different RF transmitters 415 included in the transmitter chip 105 implement respective RF radar channels. By allowing different baseband radar waveform data to be applied to different ones, or groups, of the RF transmitters 415, the different radar channels implemented by the transmitter chip 105 can have different characteristics (e.g., such as different radar pulse shapes, pulse durations, pulse intervals, etc.). For example, the baseband radar waveform data obtained from the digital processor chip 115 via the input serial port 130 and the input SerDes circuit 450 can include first baseband radar waveform data and second baseband radar waveform data different from the first baseband radar waveform data (e.g., having a different radar pulse shape, pulse duration, pulse interval, etc.). In such an example, a first one of the RF transmitters 415 may be configured to generate its output RF radar signal based on the first baseband radar waveform data, and a second one of the RF transmitters 415 may be configured to generate its output RF radar signal based on the second baseband radar waveform data.

To allow different baseband radar waveform data to be applied to different ones, or groups, of the RF transmitters 415, the example digital subsystem 405 of the transmitter chip 105 of FIG. 4 includes an example channelizer 460 in communication with the input SerDes circuit 450 and the memory 455. The channelizer 460 of the illustrated example is to store the different baseband radar waveform data for the respective ones of the RF transmitters 415 in different portions of the memory 455. For example, the channelizer 460 is to store first baseband radar waveform data, which is for a first one of the RF transmitters 415, in a first portion of the memory 455, and is to store second baseband radar waveform data, which is for a second one of the RF transmitters 415, in a second portion of the memory 455. In such an example, the first portion of the memory 455 is accessible by the first one of the RF transmitters 415, and the second portion of the memory 455 is accessible by the second one of the RF transmitters 415. In the illustrated example of FIG. 4, in which the transmitter chip 105 includes eight RF transmitters 415, the channelizer 460 is able to store up to eight different sets of baseband radar waveform data in eight different portions of the memory 455 that are accessible by corresponding ones of the eight RF transmitters 415. In some examples, the different sets of baseband radar waveform data include identifiers, addresses, etc., or any other identification information to associate a given set of baseband radar waveform data with a given one of the eight RF transmitters 415. In such examples, the channelizer 460 uses that identification information to determine which set of baseband radar waveform data to store in which portion of the memory 455.

In the illustrated example of FIG. 4, the digital subsystem 405 of the transmitter chip 105 includes an example DMA circuit 465 to transfer data between the memory 455 and the input SerDes circuit 450 and/or the channelizer 460 using DMA operations. In the illustrated example of FIG. 4, the digital subsystem 405 of the transmitter chip 105 also includes an example central processing unit (CPU) 470 to configure and control operation of the digital subsystem 405. For example, the CPU 470 can configure the channelizer 460 with the number of different radar channels implemented by the RF subsystem 410 (e.g., corresponding to the number RF transmitters 415), to thereby specify the number of portions of the memory 455 into which baseband radar waveform data is to be stored. In some examples, the CPU 470 can be used to specify whether different baseband radar waveform data is to be applied to each of the RF transmitters 415 (e.g., by configuring the channelizer 460 to write different sets of baseband radar waveform data to the different portions of the memory 455) or the same baseband radar waveform data is to be applied to each of the RF transmitters 415 (e.g., by configuring the channelizer 460 to write the same set of baseband radar waveform data to each of the different portions of the memory 455). In some examples in which the same baseband radar waveform data is to be applied to each of the RF transmitters 415, the channelizer 460 can be omitted from the transmitter chip 105 and the baseband radar waveform data can be written to a portion of the memory 455 accessible by each one of the RF transmitters 415. In some examples, the CPU 470 can configure a subgroup of the RF transmitters 415 to transmit the same baseband radar waveform data (e.g., by configuring the channelizer 460 to write the same set of baseband radar waveform data to just the portions of the memory 455 corresponding to the RF transmitters 415 in a given subgroup), with different subgroups of the RF transmitters 415 to transmit different baseband radar waveform data.

In the illustrated example of FIG. 4, the digital subsystem 405 of the transmitter chip 105 includes an example interpolator 475 to interpolate the baseband radar waveform data for a given radar channel (e.g., a given RF transmitter 415). For example, the interpolator 475 can upsample and smooth the baseband radar waveform data prior to providing the baseband radar waveform data to the RF subsystem 410 to improve quality of the resulting RF transmit signal generated from the baseband radar waveform data.

The example transmitter chip 105 of FIG. 4 includes example transmitter clock logic 480 to process the clock signal received via the transmitter clock input port 135 (e.g., from the timing chip 120). For example, the transmitter clock logic 480 can split, divide and/or multiply, etc., the clock signal received via the transmitter clock input port 135 to generate other clock signals having the same, lower and/or higher frequencies. The resulting clock signals generated by the transmitter clock logic 480 are used to drive elements of the transmitter chip 105, such as the digital subsystem 405, the DACs 420 and 425, the mixer 440, etc.

Figure 5:
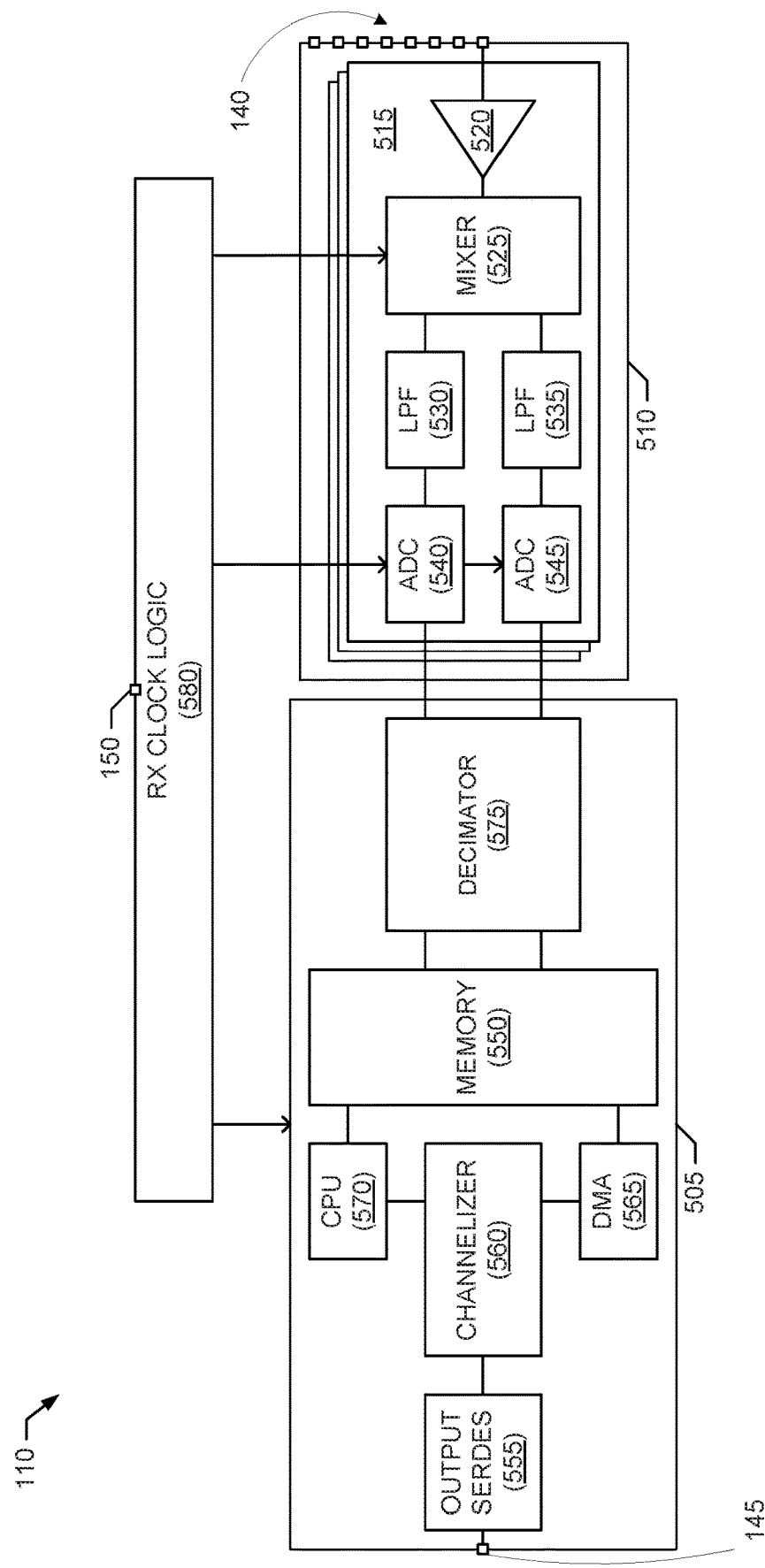
FIG. 5 is a block diagram of an example receiver chip included in the example chipset of FIG. 1.

A block diagram of an example implementation of a receiver chip 110 of the example chipset 100 of FIG. 1 is illustrated in FIG. 5. The example receiver chip 110 of FIG. 5 includes the receive antenna port(s) 140, the output serial port 145 and the receiver clock input port 150. The example receiver chip 110 of FIG. 5 also includes an example digital subsystem 505 and an example RF subsystem 510. The RF subsystem 510 of the illustrated example demodulates RF radar signal(s) received via the receive antenna port(s) 140 to determine baseband received radar data to provide to the digital subsystem 505. The digital subsystem 505 of the illustrated example obtains the baseband received radar data from the RF subsystem 510, and outputs the baseband received radar data to the output serial port 145. Accordingly, the example receiver chip 110 is an example of means for receiving, demodulating and outputting baseband received radar data in accordance with teachings of this disclosure.

The example RF subsystem 510 of the receiver chip 110 includes one or more example RF receivers 515 to implement one or more respective radar channels via which RF radar signals are to be received. For example, the RF subsystem 510 of the example receiver chip 110 of FIG. 5 includes eight RF receivers 515, with each of the eight RF receivers 515 coupled (e.g., electrically) to a corresponding one of eight receive antenna ports 140 of the receiver chip 110. However, in other examples, any number of RF receivers 515 can be included in the RF subsystem 510. In the illustrated example, the RF receivers 515 refer to the physical structure(s) (e.g., hardware circuitry and/or software, etc.) used to receive the RF radar signals of interest, the receive radar channels refer to the characteristics (e.g., bandwidth, carrier frequency, modulation, etc.) of the RF radar signals to be received by the RF receivers 515, and the RF radar signals refer to the RF energy to be received by the RF receivers 515.

In the illustrated example, a given RF receiver 515 is to demodulate in-phase (I) and quadrature (Q) baseband radar waveform data from an RF radar signal received via its respective antenna port 140. As such, an RF receiver 515 of the illustrated example includes an example power amplifier (PA) 520 to control a gain applied to the RF radar signal received via the receive antenna ports 140 associated with that RF receiver 515. The RF receiver 515 of the illustrated also includes an example mixer 525, an example in-phase LPF 530 and an example quadrature LPF 535 to downconvert and filter the received RF radar signal to form I-Q baseband received radar analog signals. The RF receiver 515 of the illustrated further includes an example in-phase analog-to-digital converter (ADC) 540 and an example quadrature ADC 545 to convert the input I-Q baseband received radar analog signals to output I-Q baseband received radar data.

The example digital subsystem 505 of the receiver chip 110 includes an example memory 550, such as a RAM and/or other memory device, to store the baseband received radar data output from the RF subsystem 510. The example digital subsystem 505 of the receiver chip 110 also includes an example output SerDes circuit 555 in communication with the memory and output serial port 145. The output SerDes circuit 555 reads baseband received radar data in parallel form (e.g., as data words each having a word length of a number of bits, such as 8 bits, 16 bits, 32 bits, etc.) from the memory 550 and converts the baseband received radar data to serial form (e.g., as serial data bits) to output via the output serial port 145 (e.g., to provide the baseband received radar data to the digital processor chip 115).

As described above, the different RF receivers 515 included in the receiver chip 110 implement respective RF radar channels. In the illustrated example of FIG. 5, the receiver chip 110 is structured to receive respective baseband received radar data for respective received RF radar signals obtained via the different RF radar channels implemented by the different RF receivers 515. As such, the baseband received radar data output from the receiver chip 110 includes the respective different baseband received radar data obtained from the different RF receivers 515. In the illustrated example, the digital subsystem 505 stores different sets of baseband received radar data output from the different ones of the RF receivers 515 in different portions of the memory 550. The digital subsystem 505 further includes an example channelizer 560 in communication with the memory 550 and the output SerDes circuit 555 to access the different sets of baseband received radar data from the different portions of the memory 550, and to write the accessed sets of baseband received radar data to the output SerDes circuit 555. For example, the channelizer 560 may access first baseband received radar data associated with a first RF radar channel from a first portion of the memory 550, and write the first baseband received radar data to the output SerDes circuit 555. Similarly, the channelizer 560 may access second baseband received radar data associated with a second RF radar channel from a second portion of the memory 550, and write the second baseband received radar data to the output SerDes circuit 555. In some examples, the channelizer 560 may include identifiers, addresses, etc., or any other identification information in the output baseband received radar data to identify the different sets of baseband received radar data associated with the different RF radar channels.

In the illustrated example of FIG. 5, the digital subsystem 505 of the receiver chip 110 includes an example DMA circuit 565 to transfer data between the memory 550 and the output SerDes circuit 555 and/or the channelizer 560 using DMA operations. In the illustrated example of FIG. 5, the digital subsystem 505 of the receiver chip 110 also includes an example CPU 570 to configure and control operation of the digital subsystem 505. For example, the CPU 570 can configure the channelizer 560 with the number of different radar channels implemented by the RF subsystem 510 (e.g., corresponding to the number RF receiver 515), to thereby specify the number of portions of the memory 550 from which baseband received radar data is to be accessed.

In the illustrated example of FIG. 5, the digital subsystem 505 of the receiver chip 110 includes an example decimator 575 to decimate the baseband received radar data for a given radar channel (e.g., a given RF receiver 515). For example, the decimator 575 can downsample and smooth the baseband received radar data prior to providing the baseband received radar data to the RF subsystem 510 to reduce the data rate of the baseband received radar data.

The example receiver chip 110 of FIG. 5 includes example receiver clock logic 580 to process the clock signal received via the receiver clock input port 150 (e.g., from the timing chip 120). For example, the receiver clock logic 580 can split, divide and/or multiply, etc., the clock signal received via the receiver clock input port 150 to generate other clock signals having the same, lower and/or higher frequencies. The resulting clock signals generated by the receiver clock logic 580 are used to drive elements of the receiver chip 110, such as the digital subsystem 505, the ADCs 540 and 545, the mixer 525, etc.

Figure 6:
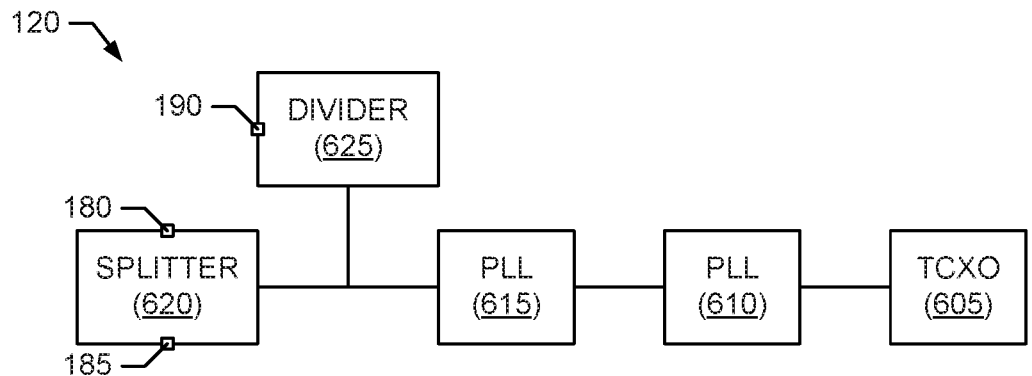
FIG. 6 is a block diagram of an example timing chip included in the example chipset of FIG. 1.

A block diagram of an example implementation of the timing chip 120 of the example chipset 100 of FIG. 1 is illustrated in FIG. 6. The example timing chip 120 of FIG. 6 includes the transmitter clock output port 180, the receiver clock output port 185 and the system clock output port 190. The example timing chip 120 of FIG. 6 also includes an example temperature controlled crystal oscillator (TCXO) 605 to provide a clock source for the clock signals to be output from the transmitter clock output port 180, the receiver clock output port 185 and the system clock output port 190. The example timing chip 120 of FIG. 6 includes one or more example phase locked loops (PLLs) 610, 615 to up-scale the clock frequency of the TCXO 605 to yield a clock signal with a higher clock frequency capable of driving the transmitter chip(s) 105 and the receiver chip(s) 110. The example timing chip 120 of FIG. 6 includes an example splitter 620, which outputs the up-scaled clock signal via the transmitter clock output port 180 and the receiver clock output port 185. The example timing chip 120 of FIG. 6 also includes an example clock divider 625, which down-scales the clock frequency of the up-scaled clock signal down to a clock frequency suitable for driving the digital processor chip 115. The clock divider 625 outputs the down-scaled clock signal via the system clock output port 190.

Figure 7:
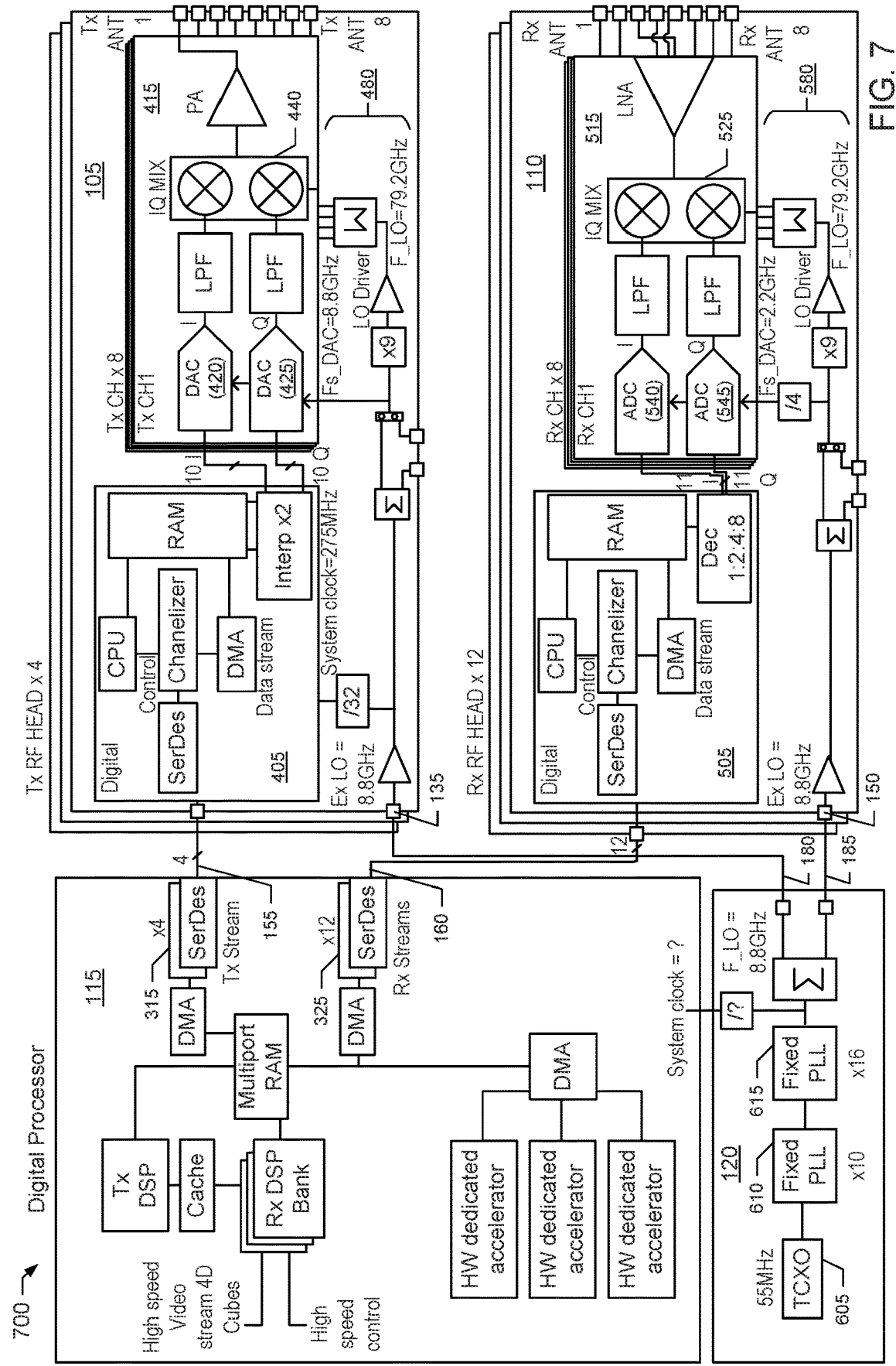
FIG. 7 is a block diagram of a second example radar imaging system implemented with the example chipset of FIG. 1.

A block diagram of a second example radar imaging system 700 implemented with the example chipset 100 of FIG. 1 is illustrated in FIG. 7. In the illustrated example of FIG. 7, the chipset 100 is arranged in a manner similar to the arrangement used in the first example radar imaging system 200 of FIG. 2. However, the radar imaging system 700 illustrates further example implementation details. For example, the radar imaging system 700 includes four transmitter chips 105 and twelve receiver chips 110. Thus, the digital processor chip 115 of the example radar imaging system 700 includes at least four transmitter serial ports 155 in communication respectively with at least four transmit SerDes circuits 315, and at least twelve receiver serial ports 160 in communication respectively with at least twelve receive SerDes circuits 325. Furthermore, each of the four transmitter chips 105 of the radar imaging system 700 includes eight RF transmitters 415, and each of the receiver chips 110 of the radar imaging system 700 includes eight RF receivers 515.

The timing chip 120 of the radar imaging system 700 includes a TCXO 605 with a clock frequency of 55 Megahertz (MHz). The PLLs 610, 615 are structured to up-scale the clock signal from the TCXO 605 by a factor of 160 to yield an up-scaled clock signal with a clock frequency of 8.8 Gigahertz (GHz), which is output via the transmitter clock output port 180 and the receiver clock output port 185. The transmitter clock logic 480 of each transmitter chip 105 receive the 8.8 GHz clock signal via its transmitter clock input port 135. The clock logic 480 passes the 8.8 GHz clock signal to drive the DACs 420 and 425, up-scales the 8.8 GHz clock signal by a factor of 9 to yield a 79.2 GHz signal to drive the mixer 440, and divides the 8.8 GHz clock signal by a factor of 32 to yield a 275 MHz signal to drive the digital subsystem 405. The receiver clock logic 580 of each receiver chip 110 receive the 8.8 GHz clock signal via its receiver clock input port 150. The clock logic 580 divides the 8.8 GHz clock signal by a factor of 4 to yield a 2.2 GHz clock signal to drive the ADCs 540 and 545, up-scales the 8.8 GHz clock signal by a factor of 9 to yield a 79.2 GHz signal to drive the mixer 525, and divides the 8.8 GHz clock signal by a factor of 32 to yield a 275 MHz signal to drive the digital subsystem 505.

While an example manners of implementing the chipset 100 alone or in the context of the example radar imaging systems 200 and/or 700 are illustrated in FIGS. 1-7, one or more of the elements, processes and/or devices illustrated in FIGS. 1-7 may be combined, divided, re-arranged, omitted, eliminated and/or implemented in any other way. Further, the example transmitter chip(s) 105, the example receiver chip(s) 110, an example digital processor chip 115, the example timing chip 120, the embedded control unit 205, the example transmit DSP 305, the example memory 310, the example SerDes circuit(s) 315, the example transmit DMA circuit 320, the example receive SerDes circuit(s) 325, the example receive DMA circuit 330, the example receive DSP(s) 340, the example hardware accelerator(s) 345, the example H/W DMA circuit 350, the example cache 355, the example digital subsystem 405, the example RF subsystem 410, example RF transmitter(s) 415, the example DACs 420/425, the example LPFs 430/435, the example mixer 440, the example PA 445, the example input SerDes circuit 450, the example memory 455, the example channelizer 460, the example DMA circuit 465, the example CPU 470, the example interpolator 475, the example transmitter clock logic 480, the example digital subsystem 505, the example RF subsystem 510, the example RF receiver(s) 515, the example PA 520, the example mixer 525, the example LPFs 530/535, the example ADCs 540/545, the example memory 550, the example output SerDes circuit 555, the example channelizer 560, the example DMA circuit 565, the example CPU 570, the example decimator 575, the example receiver clock logic 580 and/or, more generally, the example chipset 100 may be implemented by hardware, software, firmware and/or any combination of hardware, software and/or firmware. Thus, for example, any of the example transmitter chip(s) 105, the example receiver chip(s) 110, an example digital processor chip 115, the example timing chip 120, the embedded control unit 205, the example transmit DSP 305, the example memory 310, the example SerDes circuit(s) 315, the example transmit DMA circuit 320, the example receive SerDes circuit(s) 325, the example receive DMA circuit 330, the example receive DSP(s) 340, the example hardware accelerator(s) 345, the example H/W DMA circuit 350, the example cache 355, the example digital subsystem 405, the example RF subsystem 410, example RF transmitter(s) 415, the example DACs 420/425, the example LPFs 430/435, the example mixer 440, the example PA 445, the example input SerDes circuit 450, the example memory 455, the example channelizer 460, the example DMA circuit 465, the example CPU 470, the example interpolator 475, the example transmitter clock logic 480, the example digital subsystem 505, the example RF subsystem 510, the example RF receiver(s) 515, the example PA 520, the example mixer 525, the example LPFs 530/535, the example ADCs 540/545, the example memory 550, the example output SerDes circuit 555, the example channelizer 560, the example DMA circuit 565, the example CPU 570, the example decimator 575, the example receiver clock logic 580 and/or, more generally, the example chipset 100 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)), field programmable gate arrays (FPGAs) and/or field programmable logic device(s) (FPLD(s)). When reading any of the apparatus or system claims of this patent to cover a purely software and/or firmware implementation, at least one of the example chipset 100, the example transmitter chip(s) 105, the example receiver chip(s) 110, an example digital processor chip 115, the example timing chip 120, the embedded control unit 205, the example transmit DSP 305, the example memory 310, the example SerDes circuit(s) 315, the example transmit DMA circuit 320, the example receive SerDes circuit(s) 325, the example receive DMA circuit 330, the example receive DSP(s) 340, the example hardware accelerator(s) 345, the example H/W DMA circuit 350, the example cache 355, the example digital subsystem 405, the example RF subsystem 410, example RF transmitter(s) 415, the example DACs 420/425, the example LPFs 430/435, the example mixer 440, the example PA 445, the example input SerDes circuit 450, the example memory 455, the example channelizer 460, the example DMA circuit 465, the example CPU 470, the example interpolator 475, the example transmitter clock logic 480, the example digital subsystem 505, the example RF subsystem 510, the example RF receiver(s)

515, the example PA 520, the example mixer 525, the example LPFs 530/535, the example ADCs 540/545, the example memory 550, the example output SerDes circuit 555, the example channelizer 560, the example DMA circuit 565, the example CPU 570, the example decimator 575 and/or the example receiver clock logic 580 is/are hereby expressly defined to include a non-transitory computer readable storage device or storage disk such as a memory, a digital versatile disk (DVD), a compact disk (CD), a Blu-ray disk, etc. including the software and/or firmware. Further still, the example chipset 100 may include one or more elements, processes and/or devices in addition to, or instead of, those illustrated in FIGS. 1-7 and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Flowcharts representative of example hardware logic, machine readable instructions, hardware implemented state machines, and/or any combination thereof for implementing a software defined radar architecture, such as the example radar imaging systems 200 and/or 700, with the example chipset 100 are shown in FIGS. 8-11. In these examples, the machine readable instructions may be one or more executable programs or portion(s) of an executable program for execution by a computer processor, such as the processor 1212 shown in the example processor platform 1200 discussed below in connection with FIG. 12. The one or more programs, or portion(s) thereof, may be embodied in software stored on a non-transitory computer readable storage medium such as a CD-ROM, a floppy disk, a hard drive, a DVD, a Blu-ray Disk™, or a memory associated with the processor 1212, but the entire program or programs and/or parts thereof could alternatively be executed by a device other than the processor 1212 and/or embodied in firmware or dedicated hardware. Further, although the example program(s) is(are) described with reference to the flowcharts illustrated in FIGS. 8-11, many other methods of implementing software defined radar architectures with the example chipset 100 may alternatively be used. For example, with reference to the flowcharts illustrated in FIGS. 8-11, the order of execution of the blocks may be changed, and/or some of the blocks described may be changed, eliminated, combined and/or subdivided into multiple blocks. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers). The machine readable instructions may require one or more of installation, modification, adaptation, updating, combining, supplementing, configuring, decryption, decompression, unpacking, distribution, reassignment, etc. in order to make them directly readable and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein. In another example, the machine readable instructions may be stored in a state in which they may be read by a computer, but require addition of a library (e.g., a dynamic link library), a software development kit (SDK), an application programming interface (API), etc. in order to execute the instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, the disclosed machine readable instructions and/or corresponding program(s) are intended to encompass such machine readable instructions and/or program(s) regardless of the particular format or state of the machine readable instructions and/or program(s) when stored or otherwise at rest or in transit.

As mentioned above, the example processes of FIGS. 8-11 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. Also, as used herein, the terms "computer readable" and "machine readable" are considered equivalent unless indicated otherwise.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, the phrase "in communication," including variances thereof, encompasses direct communication and/or indirect communication through one or more intermediary components and does not require direct physical (e.g., wired) communication and/or constant communication, but rather additionally includes selective communication at periodic or aperiodic intervals, as well as one-time events.

Figure 8:
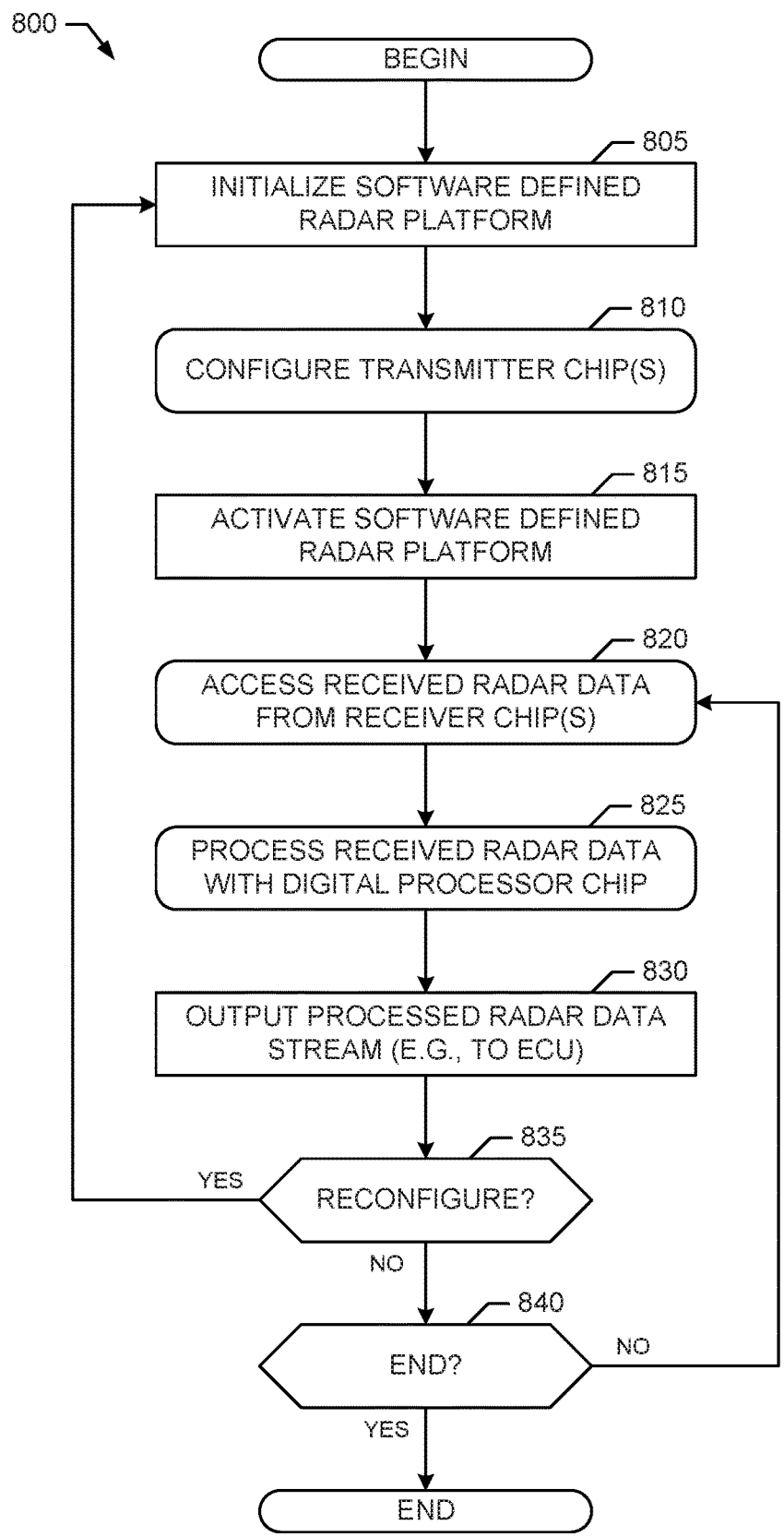
FIGS. 8-11 are flowcharts representative of example machine readable instructions that may be executed by the example digital processor chip of the example chipset of FIG. 1 to implement the example radar imaging systems of FIGS. 2 and/or 7.

An example program 800 that may be executed by the example chipset 100 to implement a software defined radar architecture, such as the example radar imaging systems 200 and/or 700, is illustrated in FIG. 8. With reference to the preceding figures and associated written descriptions, the example program 800 of FIG. 8 begins execution at block 805 at which one or more processors of the digital processor chip 115, such as the receive DSP(s) 340, obtain control data via the control port 170 of the digital processor chip 115. For example, the control data may be applied to the control port 170 by an external device, such as the embedded control unit 205. The control data obtained at block 805 is to initialize the software defined radar platform, such as the example radar imaging systems 200 and/or 700, implemented with the chipset 100. For example, the control data obtained at block 805 may configure parameters of the chipset 100, such as, but not limited to, a number of transmitter chip(s) 105 in the chipset, a number of receiver chip(s) 110 in the chipset, a number of radar channels supported by the transmitter chip(s) 105 and the receiver chips(s) 110, clock rates for the respective chips in the chipset 100, a radar scan rate and/or duration of the radar scan interval, parameters and/or other characteristic of the baseband radar waveform data to be generated for the transmitter chip(s) 105, parameters and/or other characteristic of the signal processing to be performed on the baseband received radar data to obtained from the receiver chip(s) 110, etc.

In some examples, at block 805, the receive DSP(s) 340 of the digital processor chip 115 (e.g., such as a receive DSP 340 designated to be a master receive DSP) uses the control data to configure the signal processing operations to be performed on the baseband received radar data to determine the multi-dimensional (e.g., 4D) radar imaging data to be output via the output stream port 165 of the digital processor chip 115, and promulgates other receiver-related control data to the CPU 570 of each receiver chip 110 included in the chipset 100, which enables the CPU 570 to initialize the digital subsystem 505, the RF subsystem 510 and the receiver clock logic 580 of the receiver chip 110. In some examples, the receive DSP(s) 340 (e.g., such as a receive DSP 340 designated to be a master receiver DSP) uses control data specifying the number of receiver chip(s) 110 in the chipset and/or the number of radar channels supported by the receiver chip(s) 110 to program the receive DMA 330 to read baseband received radar data from the receiver SerDes circuit(s) 325 in communication with a receiver serial port(s) 160 (e.g., which interface with the receiver chip(s) 110) and to write the baseband received radar data to the memory 310 (e.g., in respective portions of the memory 310 associated with the respective radar channels implemented by the receiver chip(s) 110). In some examples, the receive DSP(s) 340 (e.g., such as a receive DSP 340 designated to be a master receiver DSP) use the control data to configure the format of the multi-dimensional (e.g., 4D) radar imaging data to be output via the output stream port 165 of the digital processor chip 115.

In some examples, at block 805, the receive DSP(s) 340 provide the transmitter-related control data to the transmit DSP 305 of the digital processor chip 115 (e.g., via the cache 355), and the transmit DSP 305 uses the control data to configure the generation of the baseband radar waveform data to be transmitted, and also promulgates other transmitter-related control data to the CPU 470 of each transmitter chip 105 included in the chipset 100, which enables the CPU 470 to initialize the digital subsystem 405, the RF subsystem 410 and the transmitter clock logic 480 of the transmitter chip 105. In some examples, the transmit DSP 305 uses control data specifying the number of transmitter chip(s) 105 in the chipset and/or the number of radar channels supported by the transmitter chip(s) 105 to program the transmit DMA 320 to read baseband radar waveform data from the memory 310 (e.g., from respective portions of the memory 310 associated with the respective radar channels implemented by the transmitter chip(s) 105) and to write the data to the transmitter SerDes circuit(s) 315 in communication with a transmitter serial port(s) 155 (e.g., which interface with the transmitter chip(s) 105).

Figures 9, 10:
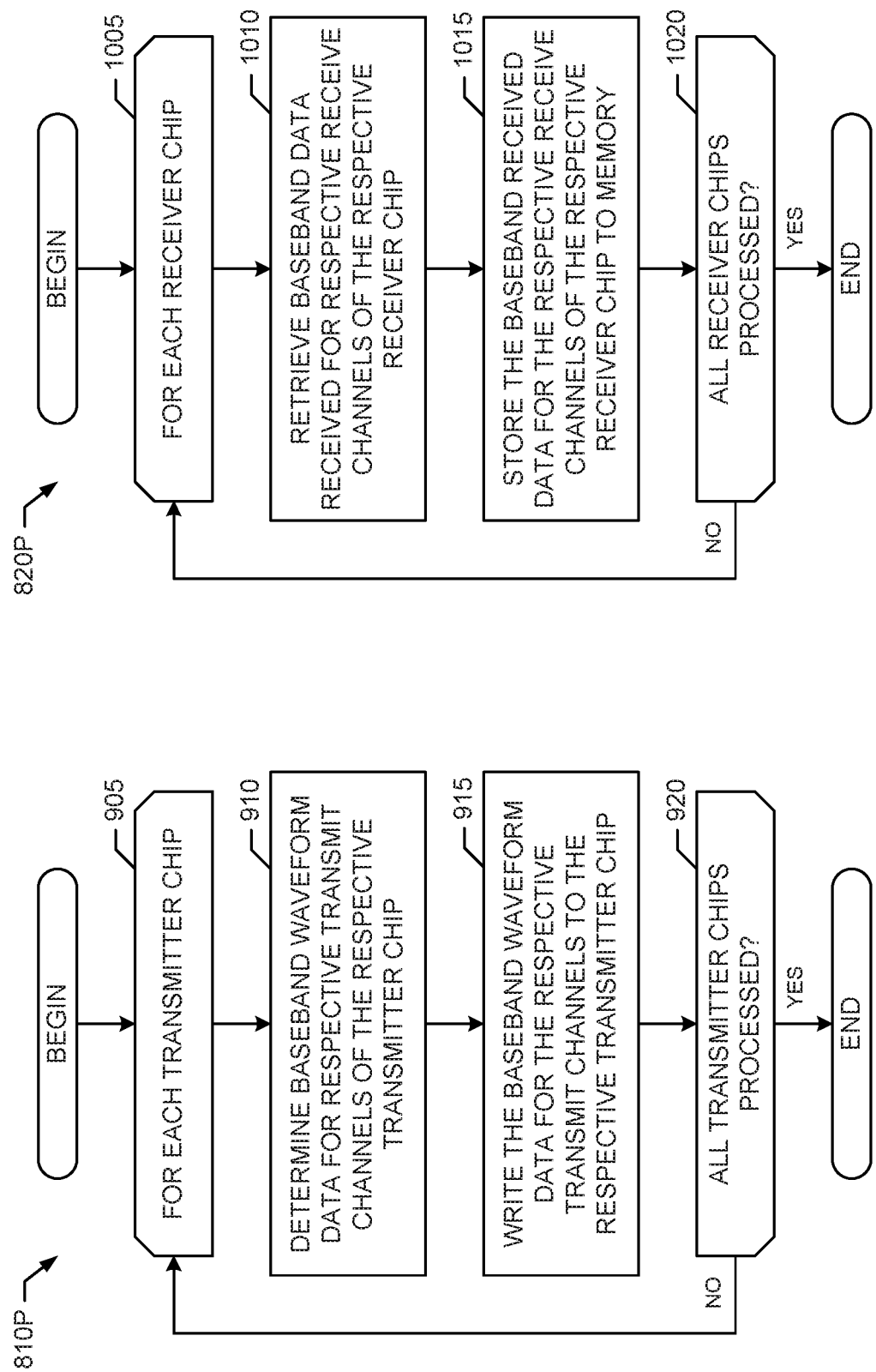

At block 810, the transmit DSP 305 of the digital processor chip 115 configures the transmitter chip(s) 105 included in the chipset 100. For example, at block 810, the transmit DSP 305 generates the baseband radar waveform data and provides the baseband radar waveform data to the transmitter chip(s) 105. An example program 810P that may be executed to implement the processing at block 810 is illustrated in FIG. 9. The example program 810P of FIG. 9 begins execution at block 905 at which the transmit DSP 305 begins generating the baseband radar waveform data for each one of the transmitter chip(s) 105 included in the chipset 100. For a given one of the transmitter chip(s) 105, at block 910 the transmit DSP 305 generates the baseband radar waveform data for respective ones of the RF transmit channels implemented by the transmitter chip 105. As described above, the RF transmitters 415 of the transmitter chip 105 implement respective RF transmit channels. In some examples, the same baseband radar waveform data may be used by the RF transmitters 415 in the transmitter chip 105 to generate their respective transmit RF signals, whereas in some examples, different baseband radar waveform data is applied to different ones, or groups, of the RF transmitters 415 for use in generating their respective transmit RF signals. In some examples, the characteristics of the baseband radar waveform data to be generated for the respective RF transmit channels of the transmitter chip 105 are specified in the control data obtained via the control port 170.

Accordingly, at block 910, the transmit DSP 305 uses the control data obtained via the control port 170 to generate the appropriate baseband radar waveform data for the respective RF transmitters 415 of the given transmitter chip 105 being configured. For example, based on the control data, the transmit DSP 305 may generate one set of baseband radar waveform data having specified characteristics (e.g., pulse shape, pulse duration, pulse interval, etc.) to be used across all of the RF transmitters 415 of the transmitter chip 105. In such an example, the transmit DSP 305 stores the set of baseband radar waveform in the memory 315 of the digital processor chip 115 for use by all of the RF transmitters 415 of the transmitter chip 105. In another example, based on the control data, the transmit DSP 305 may generate a first set of baseband radar waveform data having first specified characteristics (e.g., a first pulse shape, a first pulse duration, a first pulse interval, etc.) for a first one of the RF transmitters 415 of the transmitter chip 105, and may generate a second set of baseband radar waveform data having second specified characteristics (e.g., a second pulse shape, a second pulse duration, a second pulse interval, etc.) for a second one of the RF transmitters 415 of the transmitter chip 105, and so on for the other RF transmitters 415 of the transmitter chip 105. In such an example, the transmit DSP 305 stores the different sets of baseband radar waveform data generated for the respective RF transmitters 415 of the given transmitter chip 105 in different portions of the memory 310 allocated respectively to the corresponding RF transmitters 415 of the given transmitter chip 105.

At block 915, the transmit DSP 305 causes the baseband radar waveform data to be written to the given transmitter chip 105 being configured. For example, the transmit DSP 305 may configure the transmit DMA circuit 320 based on the input control data to read the baseband radar waveform data for the given transmitter chip 105 from the memory 315 and to write the baseband radar waveform data to the transmit SerDes circuit 315 associated with the transmitter serial port 155 coupled to the transmitter chip 105. For example, if one set of baseband radar waveform data is to be used for all RF transmitters 415 of the given transmitter chip 105, the transmit DMA circuit 320 may be configured to read the set of baseband radar waveform data from a portion of the memory 315 associated with the transmitter chip 105, and to write that set of baseband radar waveform data to the transmit SerDes circuit 315 associated with the transmitter serial port 155 coupled to the transmitter chip 105. In examples in which different sets of baseband radar waveform data are to be used for different ones of RF transmitters 415 of the given transmitter chip 105, the transmit DMA circuit 320 may configured to read the different sets of baseband radar waveform data from respective portion of the memory 315 associated with the corresponding RF transmitters 415 of the transmitter chip 105, and to write those sets of baseband radar waveform data to the transmit SerDes circuit 315 associated with the transmitter serial port 155 coupled to the transmitter chip 105. For example, the transmit DMA circuit 320 may be configured to access a first set of baseband radar waveform data associated with a first RF transmitter 415 of the transmitter chip 105 from a first portion of the memory 315 and to write that first set of baseband radar waveform data to the transmit SerDes circuit 315 associated with the transmitter chip 105, and may be configured to access a second set of baseband radar waveform data associated with a second RF transmitter 415 of the transmitter chip 105 from a second portion of the memory 315 and to write that second set of baseband radar waveform data to the transmit SerDes circuit 315 associated with the transmitter chip 105, and so one for the other RF transmitters 415 of the transmitter chip 105.

At block 920, the transmit DSP 305 continues processing until the baseband radar waveform data for all of the one or more of the transmitter chip(s) 105 included in the chipset 100 has been generated. Then, execution of the example program 810P ends.

Returning to FIG. 8, at block 815, the digital processor chip 115 activates the software defined radar platform. For example, the transmit DSP 305 and/or the receive DSP(s) 340 of the digital processor chip 115 may activate the transmitter chip(s) 105, the receiver chip(s) 110 and/or the timing chip 120 of the chipset 100 by asserting an enable pin/port on the respective chips, programming registers of the respective chips, etc.

At block 820, the receive DSP(s) 340 of the digital processor chip 115 obtain baseband received radar data from the receiver chip(s) 110 of the chipset 100 for a given scan interval. An example program 820P that may be executed to implement the processing at block 820 is illustrated in FIG. 10. The example program 820P of FIG. 10 begins at block 1005 at which the receive DSP(s) 340 begin obtaining the baseband received radar data from the receiver chip(s) 110 of the chipset 100. For a given one of the receiver chip(s) 110, at block 1010 the receive DMA 330 reads (e.g., based on an initialization performed at block 805 of FIG. 8) the baseband received radar data from the receiver SerDes circuit 325 in communication with the receiver serial port 160 associated with (e.g., coupled to) that receiver chip 110. Then, at block 1015, the receive DMA 330 writes the baseband received radar data for that receiver chip 110 to a portion of the memory 315 associated with (e.g., allocated to) that receiver chip 110. In some examples, the baseband received radar data written to the memory 315 for the given receiver chip 110 being processed includes multiple sets of baseband received radar data associated respectively with the different RF radar channels implemented by the respective RF receivers 515 of the receiver chip 110.

At block 1020, the receive DSP(s) 340 continued processing until the baseband received radar data for all one of the receiver chip(s) 110 included in the chipset 100 has been obtained for the given scan interval. Then, execution of the example program 810P ends.

Figure 11:
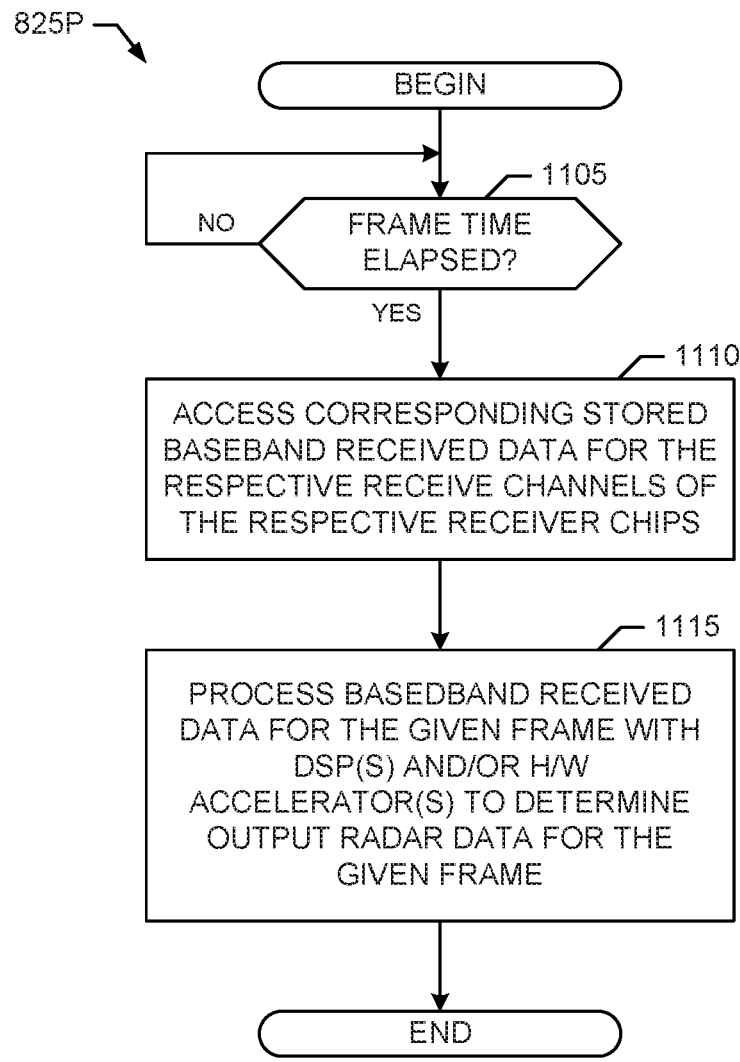

Returning to FIG. 8, at block 825, the receive DSP(s) 340 of the digital processor chip 115 process the baseband received radar data obtained from the receiver chip(s) 110 of the chipset 100 for the given scan interval to determine the multi-dimensional (e.g., 4D) radar imaging data to output for that scan interval. An example program 825P that may be executed to implement the processing at block 825 is illustrated in FIG. 11. The example program 825P of FIG. 11 begins at block 1105 at which the receive DSP(s) 340 determine whether a scan interval, also referred to as a frame time, has elapsed. If the frame time has elapsed (block 1105), at block 1110, the receive DSP(s) 340 access the baseband received radar data stored in the memory 315 for the corresponding frame time that has elapsed. For example, the receive DSP(s) 340 may access (e.g., through use of the H/W DMA circuit 350) the respective sets of baseband received radar data for the respective radar channels (e.g., RF receivers 415) implemented by the respective receive chip(s) 110 of the chipset 100. At block 1115, the receive DSP(s) 340 process the accessed baseband received radar data for the corresponding frame time that has elapsed. In some examples, the receive DSP(s) 340 invoke (e.g., through use of the H/W DMA circuit 350) one or more of the hardware accelerator(s) 345 to process the accessed baseband received radar data for the corresponding frame time that has elapsed to determine the resulting multi-dimensional (e.g., 4D) radar imaging data for the given frame. Execution of the example program 825P then ends.

Returning to FIG. 8, at block 830, the digital processor chip 115 outputs the resulting multi-dimensional (e.g., 4D) radar imaging data via the output stream port 165 of the digital processor chip 115 to an external device, such as the embedded control unit 205. At block 835, the digital processor chip 115 determines whether any reconfiguration of the chipset 100 is to be performed. For example, control data obtained via the control port 170 may specify a change to the baseband radar waveform data to be used by the transmitter chip(s) 105, a change to the processing to be performed by the digital processor chip 115 on the baseband received radar data obtained by from the receiver chip(s) 110, etc. If a reconfiguration of the chipset 100 is to be performed, execution returns to block 805 and blocks subsequent thereto. For example, by returning to block 805, the processing to be performed by the digital processor chip 115 on the baseband received radar data can be reconfigured. As another example, by returning to block 810, the baseband radar waveform data to be used by the transmitter chip(s) 105 can be changed. For example, at block 810, the transmit DSP 305 can replace a first set of baseband radar waveform data previously generated for a first RF transmitter 415 of a given transmitter chip 105 and a second set of baseband radar waveform data previously generated for a second RF transmitter 415 of the given transmitter chip 105 with a different third set of baseband radar waveform data and a different fourth set of baseband radar waveform data, respectively.

At block 840, the digital processor chip 115 determines whether operation of the chipset 100 to implement the software defined platform is to end. If operation is not to end (block 840), execution returns to block 820 and blocks subsequent thereto at which baseband received radar data for another scan interval is obtained and processed. Otherwise, execution of the example program 800 ends.

Figure 12:
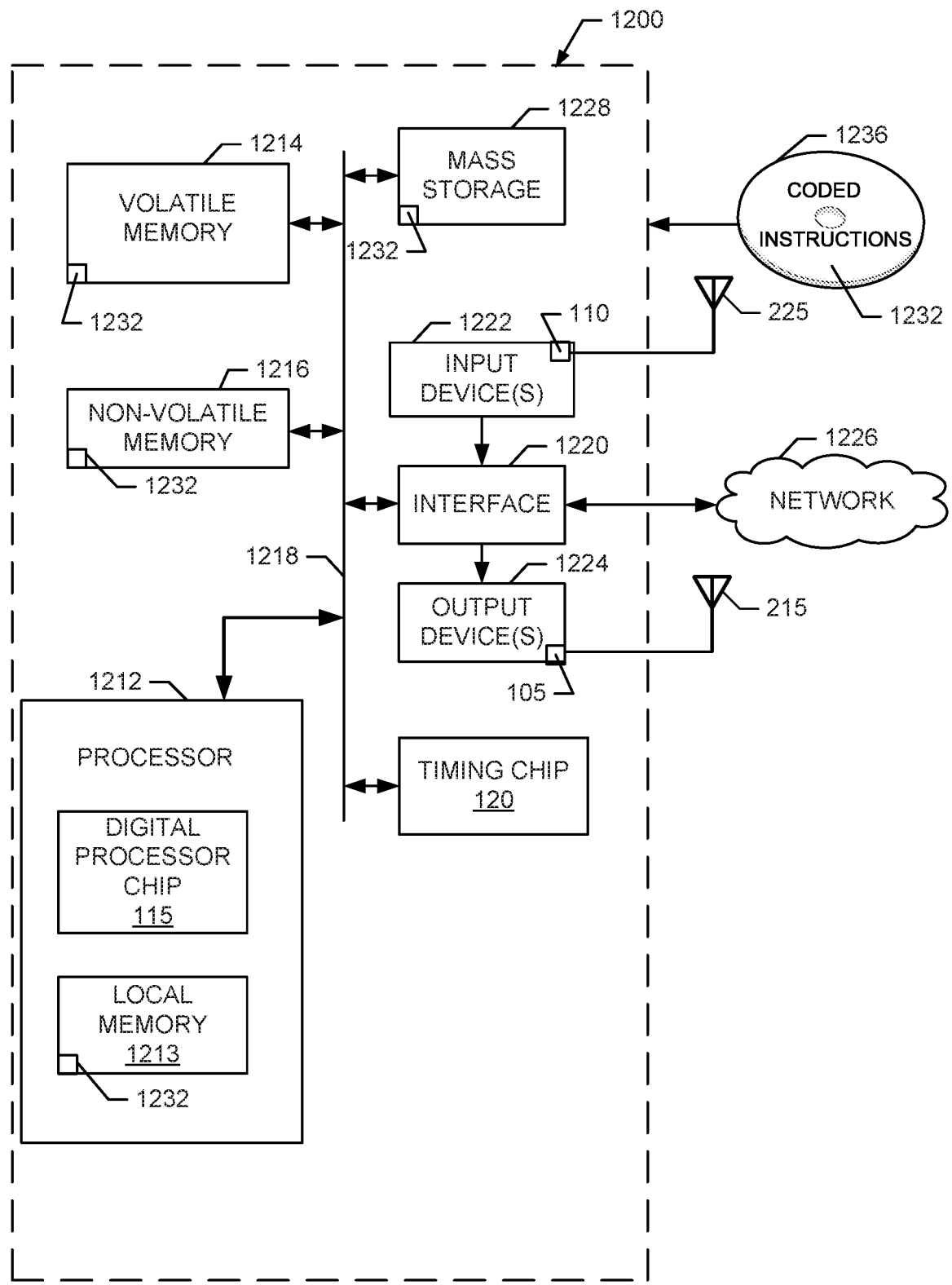
FIG. 12 is a block diagram of an example processor platform structured to execute the example machine readable instructions of FIGS. 8-10 and/or 11 to implement the example radar imaging systems of FIGS. 2 and/or 7 with the example chipset of FIG. 1.

FIG. 12 is a block diagram of an example processor platform 1200 structured to execute the instructions of FIGS. 8-11 to implement a software defined radar architecture with the example chipset 100 of FIGS. 1-7. The processor platform 1200 can be, for example, a server, a personal computer, a workstation, a self-learning machine (e.g., a neural network), a mobile device (e.g., a cell phone, a smart phone, a tablet such as an iPad™), a personal digital assistant (PDA), or any other type of computing device.

The processor platform 1200 of the illustrated example includes a processor 1212. The processor 1212 of the illustrated example is hardware. For example, the processor 1212 can be implemented by one or more integrated circuits, logic circuits, microprocessors, GPUs, DSPs, or controllers from any desired family or manufacturer. The hardware processor 1212 may be a semiconductor based (e.g., silicon based) device. In this example, the processor 1212 implements the example digital processor chip 115 of the chipset 100.

The processor 1212 of the illustrated example includes a local memory 1213 (e.g., a cache). The processor 1212 of the illustrated example is in communication with a main memory including a volatile memory 1214 and a non-volatile memory 1216 via a link 1218. The link 1218 may be implemented by a bus, one or more point-to-point connections, etc., or a combination thereof. The volatile memory 1214 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 1216 may be implemented by flash memory and/or any other desired type of memory device. Access to the main memory 1214, 1216 is controlled by a memory controller.

The processor platform 1200 of the illustrated example also includes an interface circuit 1220. The interface circuit 1220 may be implemented by any type of interface standard, such as an Ethernet interface, a universal serial bus (USB), a Bluetooth® interface, a near field communication (NFC) interface, and/or a PCI express interface.

In the illustrated example, one or more input devices 1222 are connected to the interface circuit 1220. The input device(s) 1222 permit(s) a user to enter data and/or commands into the processor 1212. The input device(s) can be implemented by, for example, an audio sensor, a microphone, a camera (still or video), a keyboard, a button, a mouse, a touchscreen, a track-pad, a trackball, a trackbar (such as an isopoint), a voice recognition system and/or any other human-machine interface. Also, many systems, such as the processor platform 1200, can allow the user to control the computer system and provide data to the computer using physical gestures, such as, but not limited to, hand or body movements, facial expressions, and face recognition. In the illustrated example, the input devices 1222 include the receiver chip(s) 110, which are in communication with the receive antennas 225.

One or more output devices 1224 are also connected to the interface circuit 1220 of the illustrated example. The output devices 1224 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker(s). The interface circuit 1220 of the illustrated example, thus, typically includes a graphics driver card, a graphics driver chip and/or a graphics driver processor. In the illustrated example, the output devices 1224 include the transmitter chip(s) 105, which are in communication with the transmit antennas 215.

The interface circuit 1220 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 1226. The communication can be via, for example, an Ethernet connection, a digital subscriber line (DSL) connection, a telephone line connection, a coaxial cable system, a satellite system, a line-of-site wireless system, a cellular telephone system, etc.

The processor platform 1200 of the illustrated example also includes one or more mass storage devices 1228 for storing software and/or data. Examples of such mass storage devices 1228 include floppy disk drives, hard drive disks, compact disk drives, Blu-ray disk drives, redundant array of independent disks (RAID) systems, and digital versatile disk (DVD) drives.

The machine executable instructions 1232 corresponding to the instructions of FIGS. 8-11 may be stored in the mass storage device 1228, in the volatile memory 1214, in the non-volatile memory 1216, in the local memory 1213 and/or on a removable non-transitory computer readable storage medium, such as a CD or DVD 1236.

From the foregoing, it will be appreciated that methods, apparatus, systems and articles of manufacture (e.g., physical storage media) to implement software defined radar architectures have been disclosed. Some examples disclosed herein leverage a radar chipset capable of implementing a digital, software defined radar platform. Disclosed example radar chipsets, such as the example chipset 100, provide many advantages over prior radar implementations. For example, the digital processor chip 115 included in the example chipset 100 enables radar algorithms to be revised through changes to software/firmware executed by the DSPs, rather than requiring structural hardware changes. Furthermore, disclosed example digital processor chips 115 are also capable of implementing digital matched filters and/or other signal processor algorithms through the use of DSPs and/or hardware accelerators. Disclosed example chipsets, such as the chipset 100, also support multiple transmit chips 105 and receive chips 110 each including multiple RF transmitters and RF receivers, respectively, capable of simultaneously transmitting and simultaneously receiving multiple radar channels. As such, disclosed example chipsets support MIMO radar architectures based on code division multiple access (CDMA), frequency division multiple access (FDMA), compressed time domain multiple access (TDMA), etc., and are not limited to just TDMA MIMO architectures. Disclosed example chipsets, such as the chipset 100, also include a local timing source capable of generating synchronous clock signal for the RF local oscillators, the digital subsystems, etc., to improve phase noise, leakage and other performance metrics relative to prior radar systems Thus, disclosed example chipsets 100 enable fast product development and improvement over time. Disclosed example chipsets 100 can output accurate multi-dimensional (e.g., 4D) radar imaging data. For example, depending on the radar waveforms, scan intervals, scan durations, etc., configured in the chipset, 4D radar imaging data containing azimuth, elevation, range and doppler values with high frame rates (e.g., 20 frames/second) can be achieved. As such, disclosed example chipsets 100 can implement radar imaging solutions for commercial products and systems (e.g., such as control systems for AVs), as well as specialized test equipment that relies on 4D radar imaging data.

The foregoing disclosure provides examples of software defined radar architectures. The following further examples, which include subject matter such as a chipset to implement a radar platform with a software defined radar architecture, a software defined radar system, at least one non-transitory computer readable medium including instructions that, when executed by at least one processor, cause the at least one processor to implement a software defined radar platform, and a method implement a software defined radar platform, are disclosed herein. Disclosed examples can be implemented individually and/or in one or more combinations.

Example 1 is a chipset to implement a software defined radar architecture. The chipset of example 1 includes a digital processor chip including a first serial port and a second serial port. The chipset of example 1 also includes a transmitter chip to generate a plurality of transmit signals based on baseband radar waveform data to be obtained from the digital processor chip, the transmitter chip including a third serial port to communicate with the first serial port of the digital processor chip to obtain the baseband radar waveform data. The chipset of example 1 further includes a receiver chip to determine baseband received radar data from a plurality of radar signals, the receiver chip including a fourth serial port to communicate with the second serial port of the digital processor chip to provide the baseband received radar data to the digital processor chip.

Example 2 includes the subject matter of example 1, and further includes a timing chip. The timing chip of example 2 includes: a first clock output to provide a first clock signal to the digital processor chip, a second clock output to provide a second clock signal to the transmitter chip, a third clock output to provide a third clock signal to the receiver chip, and a clock source. In example 2, the first clock signal, the second clock signal and the third clock signal are to be based on the clock source.

Example 3 includes the subject matter of example 1, wherein the digital processor chip further includes: (i) a transmit digital signal processor to generate the baseband radar waveform data, (ii) a memory to store the baseband radar waveform data, (iii) first serializer-deserializer circuitry in communication with the first serial port, the first serializer-deserializer circuitry to access the baseband radar waveform data from the memory, the first serializer-deserializer circuitry to write the accessed baseband radar waveform data to the first serial port, and (iv) second serializer-deserializer circuitry in communication with the second serial port, the second serializer-deserializer circuitry to read the baseband received radar data from the second serial port.

Example 4 includes the subject matter of example 3, wherein the digital processor chip further includes: (i) a receive digital signal processor, (ii) a hardware accelerator, and (iii) an output port, at least one of the receiver digital signal processor or the hardware accelerator to process the baseband received radar data to determine multi-dimensional output radar data, the output port to provide the multi-dimensional output radar data to a device in communication with the output port.

Example 5 includes the subject matter of example 3, wherein the memory is a first memory, and the transmitter chip further includes: (i) third serializer-deserializer circuitry in communication with the third serial port of the transmitter chip, the third serializer-deserializer circuitry to read the baseband radar waveform data from the third serial port of the transmitter chip, (ii) a second memory to store the baseband radar waveform data, and (iii) a plurality of radio frequency transmitters to generate the plurality of transmit signals based on the baseband radar waveform data.

Example 6 includes the subject matter of example 5, wherein the plurality of transmit signals corresponds to a respective plurality of different channels, the baseband radar waveform data includes first baseband radar waveform data and second baseband radar waveform data different from the first baseband radar waveform data, a first one of the radio frequency transmitters is to generate a first one of the transmit signals based on the first baseband radar waveform data, and a second one of the radio frequency transmitters is to generate a second one of the transmit signals based on the second baseband radar waveform data.

Example 7 includes the subject matter of example 5, wherein the transmitter chip further includes a channelizer in communication with the third serializer-deserializer circuitry. The channelizer of example 7 is to: store the first baseband radar waveform data in a first portion of the second memory to be accessible by the first one of the radio frequency transmitters, and store the second baseband radar waveform data in a second portion of the second memory to be accessible by the second one of the radio frequency transmitters.

Example 8 includes the subject matter of example 3, wherein the digital processor chip further includes: (i) a receive digital signal processor, (ii) a hardware accelerator, and (iii) an output port, at least one of the receiver digital signal processor or the hardware accelerator to process the baseband received radar data to determine multi-dimensional output radar data, the output port to provide the multi-dimensional output radar data to a device in communication with the output port.

Example 9 includes the subject matter of example 8, wherein the plurality of received radar signals corresponds to a respective plurality of different channels, the baseband received radar data includes first baseband received radar data to be determined by a first one of the radio frequency receivers from a first one of the received radar signals, and the baseband received radar data includes second baseband received radar data to be determined by a second one of the radio frequency receivers from a second one of the received radar signals.

Example 10 includes the subject matter of example 9, wherein the receiver chip further includes a channelizer to: (i) access the first baseband received radar data from the second memory, (ii) write the first baseband received radar data to the third serializer-deserializer circuitry, (iii) access the second baseband received radar data from the second memory, and (iv) write the second baseband received radar data to the third serializer-deserializer circuitry.

Example 11 is a software defined radar system including a processing device to process multi-dimensional output radar data, a plurality of antennas to transmit and receive radio frequency signals, and a software defined radar platform in communication with the processing device and the plurality of antennas. The software defined radar platform of example 11 includes a digital processor chip including a first data interface and a second data interface. The software defined radar platform of example 11 also includes a transmitter chip to generate a plurality of transmit signals based on baseband radar waveform data to be obtained from the digital processor chip, the transmitter chip including a third data interface in circuit with the first data interface of the digital processor chip to obtain the baseband radar waveform data, the transmitter chip including first memory to store the baseband radar waveform data, the transmitter chip to transmit the plurality of transmit signals via the plurality of antennas. The software defined radar platform of example 11 further includes a receiver chip to determine baseband received radar data from a plurality of radar signals, the receiver chip to receive the plurality of radar signals via the plurality of antennas, the receiver chip including second memory to store the baseband received radar data, the receiver chip including a fourth data interface in circuit with the second data interface of the digital processor chip to provide the baseband received radar data to the digital processor chip.

Example 12 includes the subject matter of example 11, wherein the software defined radar platform further includes a timing chip. The timing chip of example 12 includes (i) a first clock output in circuit with the digital processor chip, (ii) a second clock output in circuit with the transmitter chip, (iii) a third clock in circuit with the receiver chip, and (iv) a clock source. In example 12, the first clock output, the second clock output and the third clock output are to be based on the clock source.

Example 13 includes the subject matter of example 11, wherein the first digital data interface includes a first serial port, the second digital interface includes a second serial port, and the digital processor chip further includes: (i) a transmit digital signal processor to generate the baseband radar waveform data, (ii) a third memory to store the baseband radar waveform data, (iii) first serializer-deserializer circuitry in communication with the first serial port, the first serializer-deserializer circuitry to access the baseband radar waveform data from the memory, the first serializer-deserializer circuitry to write the accessed baseband radar waveform data to the first serial port, (iv) second serializer-deserializer circuitry in communication with the second serial port, the second serializer-deserializer circuitry to read the baseband received radar data from the second serial port, (v) a receive digital signal processor, (vi) a hardware accelerator, and (vii) an output port, at least one of the receiver digital signal processor or the hardware accelerator to process the baseband radar waveform data to determine the multi-dimensional output radar data, the output port to provide the multi-dimensional output radar data to the processing device.

Example 14 includes the subject matter of example 13, wherein the third digital data interface includes a third serial port, and the fourth digital data interface includes a fourth serial port. In example 14, the transmitter chip further includes: (i) third serializer-deserializer circuitry in communication with the third serial port of the transmitter chip, the third serializer-deserializer circuitry to read the baseband radar waveform data from the third serial port of the transmitter chip, and (ii) a plurality of radio frequency transmitters to generate the plurality of transmit signals based on the baseband radar waveform data. In example 14, the receiver chip further includes: (i) a plurality of radio frequency receivers to determine the baseband received radar data from the plurality of received radar signals, and (ii) fourth serializer-deserializer circuitry in communication with the fourth serial port of the receiver chip, the fourth serializer-deserializer circuitry to write the baseband received radar data to the fourth serial port of the receiver chip.

Example 15 includes the subject matter of example 14, wherein the baseband radar waveform data includes first baseband radar waveform data and second baseband radar waveform data different from the first baseband radar waveform data, a first one of the radio frequency transmitters is to generate a first one of the transmit signals based on the first baseband radar waveform data, and a second one of the radio frequency transmitters is to generate a second one of the transmit signals based on the second baseband radar waveform data. Example 15 further includes a channelizer in communication with the third serializer-deserializer circuitry. The channelizer of example 15 is to store the first baseband radar waveform data in a first portion of the second memory to be accessible by the first one of the radio frequency transmitters, and store the second baseband radar waveform data in a second portion of the second memory to be accessible by the second one of the radio frequency transmitters.

Example 16 is at least one non-transitory computer readable medium including computer readable instructions which, when executed, cause one or more processors to at least: (i) generate baseband radar waveform data corresponding to a plurality of radar transmit signals, (ii) cause the baseband radar waveform data to be written to a first serial port that is to interface with a transmitter chip, (iii) cause baseband received radar data to be read from a second serial port that is to interface with a receiver chip, (iv) process the baseband received radar data to determine multi-dimensional output radar data, and (v) cause the multi-dimensional output radar data to be written to an output port.

Example 17 includes the subject matter of example 16, wherein the baseband radar waveform data includes first baseband radar waveform data and second baseband radar waveform data different from the first baseband radar waveform data, the first baseband radar waveform data corresponding to a first one of the plurality of radar transmit signals, the second baseband radar waveform data corresponding to a second one of the plurality of radar transmit signals, and the instructions, when executed, cause the one or more processors to generate the first baseband radar waveform data and the second baseband radar waveform data based on input control data.

Example 18 includes the subject matter of example 17, wherein the instructions, when executed, cause the one or more processors to process the baseband received radar data based on the input control data to determine the multi-dimensional output radar data.

Example 19 includes the subject matter of example 18, wherein the input control data is first input control data and, responsive to second input control data obtained after the first input control data, the instructions, when executed, cause the one or more processors to: (i) replace the first baseband radar waveform data with third baseband radar waveform data, (ii) replace the second baseband radar waveform data with fourth baseband radar waveform data different from the third baseband radar waveform data, and (iii) process the baseband received radar data based on the second input control data to determine the multi-dimensional output radar data.

Example 20 includes the subject matter of example 16, wherein the instructions, when executed, cause the one or more processors to: program a first direct memory access controller to write the baseband radar waveform data to first serializer-deserializer circuitry in communication with the first serial port to cause the baseband radar waveform data to be written to the first serial port; and program a second direct memory access controller to read the baseband received radar data from second serializer-deserializer circuitry in communication with the second serial port to cause the baseband radar waveform data to be read from the second serial port.

Example 21 includes the subject matter of example 16, wherein the instructions, when executed, cause the one or more processors to invoke a hardware accelerator to process the baseband received radar data to determine the multi-dimensional output radar data.

Example 22 is a method to implement a software defined radar platform. The method of example 22 includes writing, by a first direct memory access controller, baseband radar waveform data to first serializer-deserializer circuitry in communication with a first serial port that is to interface with a transmitter chip, the baseband radar waveform data corresponding to a plurality of radar transmit signals. The method of example 22 also includes reading, by a second direct memory access controller, baseband received radar data from second serializer-deserializer circuitry in communication with a second serial port that is to interface with a receiver chip. The method of example 22 further includes generating, by executing an instruction with at least one processor, the baseband radar waveform data. The method of example 22 also includes processing, by executing an instruction with the at least one processor, the baseband received radar data to determine multi-dimensional output radar data. The method of example 22 further includes outputting the multi-dimensional output radar data to an output port.

Example 23 includes the subject matter of example 22, wherein the generating of the baseband radar waveform data includes: (i) generating first baseband radar waveform data corresponding to a first one of the plurality of radar transmit signals based on input control data, (ii) storing the first baseband radar waveform data in memory, (iii) generating second baseband radar waveform data corresponding to a second one of the plurality of radar transmit signals based on the input control data, the second baseband radar waveform data different from the first baseband radar waveform data, and (iv) storing the second baseband radar waveform data in the memory.

Example 24 includes the subject matter of example 23, and further includes writing, by the second direct memory access controller, the baseband received radar data to the memory.

Example 25 includes the subject matter of example 24, wherein the processing of the baseband received radar data includes: (i) reading, by a third direct memory access controller, the baseband received radar data from the memory, (ii) writing, by the third direct memory access controller, the baseband received radar data to a hardware accelerator, and (iii) invoking the hardware accelerator to process the baseband received radar data to determine the multi-dimensional output radar data.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A chipset to implement a software defined radar architecture, the chipset comprising:

a digital processor chip including a first serial port and a second serial port;

a transmitter chip to generate a plurality of transmit signals based on baseband radar waveform data to be obtained from the digital processor chip, the transmitter chip including a third serial port to communicate with the first serial port of the digital processor chip to obtain the baseband radar waveform data;

a receiver chip to determine baseband received radar data from a plurality of radar signals, the receiver chip including a fourth serial port to communicate with the second serial port of the digital processor chip to provide the baseband received radar data to the digital processor chip; and a timing chip, the timing chip including:

a first clock output to provide a first clock signal to the digital processor chip;

a second clock output to provide a second clock signal to the transmitter chip;

a third clock output to provide a third clock signal to the receiver chip; and a clock source;

the first clock signal, the second clock signal and the third clock signal to be based on the clock source.

2. A chipset to implement a software defined radar architecture, the chipset comprising:

a digital processor chip including a first serial port and a second serial port;

a transmitter chip to generate a plurality of transmit signals based on baseband radar waveform data to be obtained from the digital processor chip, the transmitter chip including a third serial port to communicate with the first serial port of the digital processor chip to obtain the baseband radar waveform data; and a receiver chip to determine baseband received radar data from a plurality of received radar signals, the receiver chip including a fourth serial port to communicate with the second serial port of the digital processor chip to provide the baseband received radar data to the digital processor chip, wherein, the digital processor chip further includes:

a transmit digital signal processor to generate the baseband radar waveform data;

a memory to store the baseband radar waveform data;

first serializer-deserializer circuitry in communication with the first serial port, the first serializer-deserializer circuitry to access the baseband radar waveform data from the memory, the first serializer-deserializer circuitry to write the accessed baseband radar waveform data to the first serial port; and second serializer-deserializer circuitry in communication with the second serial port, the second serializer-deserializer circuitry to read the baseband received radar data from the second serial port.

3. The chipset of claim 2, wherein the digital processor chip further includes:

a receive digital signal processor;

a hardware accelerator; and an output port, at least one of the receiver digital signal processor or the hardware accelerator to process the baseband received radar data to determine multi-dimensional output radar data, the output port to provide the multi-dimensional output radar data to a device in communication with the output port.

4. The chipset of claim 2, wherein the memory is a first memory, and the transmitter chip further includes:

third serializer-deserializer circuitry in communication with the third serial port of the transmitter chip, the third serializer-deserializer circuitry to read the baseband radar waveform data from the third serial port of the transmitter chip;

a second memory to store the baseband radar waveform data; and a plurality of radio frequency transmitters to generate the plurality of transmit signals based on the baseband radar waveform data.

5. The chipset of claim 4, wherein the plurality of transmit signals corresponds to a respective plurality of different channels, the baseband radar waveform data includes first baseband radar waveform data and second baseband radar waveform data different from the first baseband radar waveform data, a first one of the radio frequency transmitters is to generate a first one of the transmit signals based on the first baseband radar waveform data, and a second one of the radio frequency transmitters is to generate a second one of the transmit signals based on the second baseband radar waveform data.

6. The chipset of claim 5, wherein the transmitter chip further includes a channelizer in communication with the third serializer-deserializer circuitry, the channelizer to:

store the first baseband radar waveform data in a first portion of the second memory to be accessible by the first one of the radio frequency transmitters; and store the second baseband radar waveform data in a second portion of the second memory to be accessible by the second one of the radio frequency transmitters.

7. The chipset of claim 2, wherein the memory is a first memory, and the receiver chip further includes:

a plurality of radio frequency receivers to determine the baseband received radar data from the plurality of received radar signals;

a second memory to store the baseband received radar data; and third serializer-deserializer circuitry in communication with the fourth serial port of the receiver chip, the third serializer-deserializer circuitry to write the baseband received radar data to the fourth serial port of the receiver chip.

8. The chipset of claim 7, wherein the plurality of received radar signals corresponds to a respective plurality of different channels, the baseband received radar data includes first baseband received radar data to be determined by a first one of the radio frequency receivers from a first one of the received radar signals, and the baseband received radar data includes second baseband received radar data to be determined by a second one of the radio frequency receivers from a second one of the received radar signals.

9. The chipset of claim 8, wherein the receiver chip further includes a channelizer to:

access the first baseband received radar data from the second memory;

write the first baseband received radar data to the third serializer-deserializer circuitry;

access the second baseband received radar data from the second memory; and write the second baseband received radar data to the third serializer-deserializer circuitry.

10. A software defined radar system comprising:

a processing device to process multi-dimensional output radar data;

a plurality of antennas to transmit and receive radio frequency signals; and a software defined radar platform in communication with the processing device and the plurality of antennas, the software defined radar platform including:

a digital processor chip including a first data interface and a second data interface;

a transmitter chip to generate a plurality of transmit signals based on baseband radar waveform data to be obtained from the digital processor chip, the transmitter chip including a third data interface in circuit with the first data interface of the digital processor chip to obtain the baseband radar waveform data, the transmitter chip including first memory to store the baseband radar waveform data, the transmitter chip to transmit the plurality of transmit signals via the plurality of antennas;

a receiver chip to determine baseband received radar data from a plurality of radar signals, the receiver chip to receive the plurality of radar signals via the plurality of antennas, the receiver chip including second memory to store the baseband received radar data, the receiver chip including a fourth data interface in circuit with the second data interface of the digital processor chip to provide the baseband received radar data to the digital processor chip; and a timing chip, the timing chip including:

a first clock output in circuit with the digital processor chip;

a second clock output in circuit with the transmitter chip;

a third clock output in circuit with the receiver chip; and
a clock source;
the first clock output, the second clock output and the third clock output to be based on the clock source.

11. A software defined radar system comprising:
a processing device to process multi-dimensional output radar data;
a plurality of antennas to transmit and receive radio frequency signals; and
a software defined radar platform in communication with the processing device and the plurality of antennas, the software defined radar platform including:
a digital processor chip including a first data interface and a second data interface, wherein the first data interface includes a first serial port, and the second data interface includes a second serial port;
a transmitter chip to generate a plurality of transmit signals based on baseband radar waveform data to be obtained from the digital processor chip, the transmitter chip including a third data interface in circuit with the first data interface of the digital processor chip to obtain the baseband radar waveform data, the transmitter chip including first memory to store the baseband radar waveform data, the transmitter chip to transmit the plurality of transmit signals via the plurality of antennas; and
a receiver chip to determine baseband received radar data from a plurality of received radar signals, the receiver chip to receive the plurality of received radar signals via the plurality of antennas, the receiver chip including second memory to store the baseband received radar data, the receiver chip including a fourth data interface in circuit with the second data interface of the digital processor chip to provide the baseband received radar data to the digital processor chip, wherein,
the digital processor chip further includes:
a transmit digital signal processor to generate the baseband radar waveform data;
a third memory to store the baseband radar waveform data;
first serializer-deserializer circuitry in communication with the first serial port, the first serializer-deserializer circuitry to access the baseband radar waveform data from the memory, the first serializer-deserializer circuitry to write the accessed baseband radar waveform data to the first serial port;
second serializer-deserializer circuitry in communication with the second serial port, the second serializer-deserializer circuitry to read the baseband received radar data from the second serial port;
a receive digital signal processor;
a hardware accelerator; and
an output port, at least one of the receiver digital signal processor or the hardware accelerator to process the baseband radar waveform data to determine the multi-dimensional output radar data, the output port to provide the multi-dimensional output radar data to the processing device.

12. The system of claim 11, wherein the third data interface includes a third serial port, the fourth data interface includes a fourth serial port, and:
the transmitter chip further includes:
third serializer-deserializer circuitry in communication with the third serial port of the transmitter chip, the third serializer-deserializer circuitry to read the baseband radar waveform data from the third serial port of the transmitter chip; and
a plurality of radio frequency transmitters to generate the plurality of transmit signals based on the baseband radar waveform data; and
the receiver chip further includes:
a plurality of radio frequency receivers to determine the baseband received radar data from the plurality of received radar signals; and
fourth serializer-deserializer circuitry in communication with the fourth serial port of the receiver chip, the fourth serializer-deserializer circuitry to write the baseband received radar data to the fourth serial port of the receiver chip.

13. The system of claim 12, wherein the baseband radar waveform data includes first baseband radar waveform data and second baseband radar waveform data different from the first baseband radar waveform data, a first one of the radio frequency transmitters is to generate a first one of the transmit signals based on the first baseband radar waveform data, a second one of the radio frequency transmitters is to generate a second one of the transmit signals based on the second baseband radar waveform data, and further including a channelizer in communication with the third serializer-deserializer circuitry, the channelizer to:
store the first baseband radar waveform data in a first portion of the second memory to be accessible by the first one of the radio frequency transmitters; and
store the second baseband radar waveform data in a second portion of the second memory to be accessible by the second one of the radio frequency transmitters.

* * * * *